United States Patent
Shen et al.

(10) Patent No.: US 9,856,565 B2
(45) Date of Patent: Jan. 2, 2018

(54) METALLIZATION AND SURFACE COATING SOLUTION ON GLASS FILLER HIGH PEFORMANCE AMORPHOUS POLYMER COMPOSITIONS

(71) Applicant: SABIC GLOBAL TECHNOLOGIES B.V., Bergen Op Zoom (NL)

(72) Inventors: Liang Shen, Shanghai (CN); Yangang Yan, Shanghai (CN); Wei Feng, Shanghai (CN)

(73) Assignee: SABIC GLOBAL TECHNOLOGIES B.V., Bergen Op Zoom (NL)

( * ) Notice: Subject to any disclaimer, the term of this patent is extended or adjusted under 35 U.S.C. 154(b) by 1274 days.

(21) Appl. No.: 13/884,296

(22) PCT Filed: Dec. 31, 2012

(86) PCT No.: PCT/CN2012/088051
§ 371 (c)(1),
(2) Date: May 9, 2013

(87) PCT Pub. No.: WO2014/101188
PCT Pub. Date: Jul. 3, 2014

(65) Prior Publication Data
US 2016/0289842 A1    Oct. 6, 2016

(51) Int. Cl.
| | | |
|---|---|---|
| *C23C 28/00* | (2006.01) |
| *C23C 26/00* | (2006.01) |
| *C23C 14/34* | (2006.01) |
| *C23C 14/26* | (2006.01) |
| *C23C 14/20* | (2006.01) |
| *B05D 7/02* | (2006.01) |
| *C08J 7/04* | (2006.01) |
| *C08J 7/12* | (2006.01) |
| *G11B 33/02* | (2006.01) |
| *G11B 33/14* | (2006.01) |
| *B29C 45/00* | (2006.01) |
| *B29C 70/58* | (2006.01) |
| *B29K 79/00* | (2006.01) |
| *B29K 81/00* | (2006.01) |
| *B29K 105/16* | (2006.01) |
| *B29K 509/08* | (2006.01) |

(52) U.S. Cl.
CPC ............... *C23C 28/00* (2013.01); *B05D 7/02* (2013.01); *C08J 7/04* (2013.01); *C08J 7/123* (2013.01); *C23C 14/20* (2013.01); *C23C 14/26* (2013.01); *C23C 14/34* (2013.01); *C23C 26/00* (2013.01); *G11B 33/027* (2013.01); *G11B 33/1493* (2013.01); *B29C 45/0013* (2013.01); *B29C 70/58* (2013.01); *B29K 2079/085* (2013.01); *B29K 2081/00* (2013.01); *B29K 2105/16* (2013.01); *B29K 2509/08* (2013.01); *C08J 2379/08* (2013.01); *C08J 2433/08* (2013.01)

(58) Field of Classification Search
None
See application file for complete search history.

(56) References Cited

U.S. PATENT DOCUMENTS

| | | |
|---|---|---|
| 4,544,571 A | 10/1985 | Miller |
| 4,952,448 A | 8/1990 | Bullock et al. |
| 5,945,213 A | 8/1999 | Nagaike et al. |
| 2003/0004280 A1 | 1/2003 | Gallucci |
| 2010/0291381 A1* | 11/2010 | Elia ............... C23C 18/1641 428/339 |
| 2010/0304065 A1 | 12/2010 | Tomantschger et al. |
| 2012/0275286 A1* | 11/2012 | McGuire, Jr. ........ G11B 25/043 369/75.11 |

FOREIGN PATENT DOCUMENTS

| | | |
|---|---|---|
| CN | 1185089 A | 6/1998 |
| EP | 0391201 A1 | 10/1990 |
| EP | 1835505 A1 | 9/2007 |
| JP | H04337078 A | 11/1992 |
| JP | H09135097 A | 5/1997 |
| JP | 2001152014 A | 6/2001 |
| JP | 2003301105 A | 10/2003 |
| JP | 2004045883 A | 2/2004 |
| JP | 2005175243 A | 6/2005 |
| JP | 2011073322 A | 4/2011 |
| WO | 02102899 A2 | 12/2002 |
| WO | 2011006211 A1 | 1/2011 |
| WO | 2014101189 A1 | 7/2014 |

OTHER PUBLICATIONS

International Search Report and Written Opinion of the International Searching Authority for PCT/CN2012/08851, dated Oct. 3, 2013, 14 pages.

* cited by examiner

*Primary Examiner* — Sheeba Ahmed
(74) *Attorney, Agent, or Firm* — Cantor Colburn LLP

(57) ABSTRACT

A composition including from 35 to 85% by weight based on the weight of the composition of a high-heat amorphous polymeric material, having a glass transition temperature of at least 180 degrees Celsius, from 10 to 50% by weight based on the weight of the composition of a filler selected from glass fiber, glass flake, flat glass fiber, glass bead, and combinations thereof; and from 0 to 10% by weight of composition of at least one additive selected from a flow promoter, a thermal stabilizer, a mold release agent, and combinations thereof. Products including the composition, such as a hard disc drive enclosure.

12 Claims, 8 Drawing Sheets

| SURFACE | DESCRIPTION | ISO | ASTM |
|---|---|---|---|
| 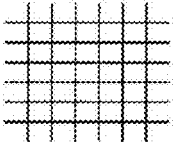 | THE EDGES OF THE CUTS ARE COMPLETELY SMOOTH; NONE OF THE SQUARES OF THE LATTICE IS DETACHED. | 0 | 5B |
| 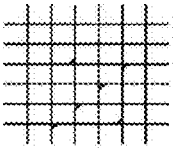 | DETACHMENT OF FLAKES OF THE COATING AT THE INTERSECTION OF THE CUTS. A CROSS CUT AREA NOT SIGNIFICANTLY GREATER THAN 5% IS AFFECTED. | 1 | 4B |
| 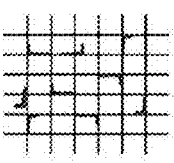 | THE COATING HAS FLAKED ALONG THE EDGES AND/OR AT THE INTERSENTIONS OF THE CUTS. A CROSS CUT AREA SIGNIFICANTLY GREATER THAN 5%, BUT NOT SIGNIFICANTLY GREATER THAN 15% IS AFFECTED. | 2 | 3B |
| 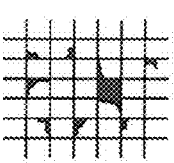 | THE COATING HAS FLAKED ALONG THE EDGES OF THE CUTS PARTLY OR WHOLLY IN LARGE RIBBONS, AND/OR IT HAS FLAKED PARTLY OR WHOLLY ON DIFFERENT PARTS OF THE SQUARES. A CROSS CUT AREA SIGNIFICANTLY GREATER THAN 15%, BUT NOT SIGNIFICANTLY GREATER THAN 35% IS AFFECTED. | 3 | 2B |
| 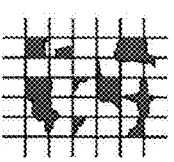 | THE COATING HAS FLAKED ALONG THE EDGES OF THE CUTS IN LARGE RIBBONS AN/OR SOME SQUARES HAVE DETACHED PARTLY OR WHOLLY. A CROSS CUT AREA SIGNIFICANTLY GREATER THAN 35%, BUT NOT SIGNIFICANTLY GREATER THAN 65% IS AFFECTED. | 4 | 1B |
|  | ANY DEGREE OF FLAKING THAT CANNOT BE CLASSIFIED EVEN BY CLASSIFICATION 4 (1B). | 5 | 0B |

Fig. 5

METALLIZATION AND SURFACE COATING SOLUTION ON GLASS FILLER HIGH PEFORMANCE AMORPHOUS POLYMER COMPOSITIONS

CROSS REFERENCE TO RELATED APPLICATIONS

This application is the National Stage entry under 35 U.S.C. 371 of International Application PCT/2012CN/088051 tiled Dec. 31, 2012.

BACKGROUND OF THE INVENTION

High performance (high heat) amorphous polymers (Tg greater than or equal to 180 degrees Celsius) with filler compositions can be applied in the manufacture of molded articles for metal replacement applications, e.g., hard disc drive, with good mechanical properties, excellent dimensional stability at elevated temperatures. To meet all the performances, fillers have to be introduced into the resins for at least certain amount. In the meantime, such compositions are required excellent cleanliness properties, as evident from the outgassing, leachable on chromatograph (IC), Liquid Particle Count (LPC), and nonvolatile residue (NVR) performance properties of the final part. However, filler reinforced high performance polymer parts showed very rough surface after molding due to filler floating onto the surface, which leads to poor cleanliness performance. There is a need to provide a metallization method to achieve an Electro Magnetic Interference (EMI) shielding effect on the glass reinforced high performance polymer based articles.

BRIEF SUMMARY OF THE INVENTION

According to various embodiments, nano-scale metal layers were introduced on the plastics article surface by sputtering or PVD (Physical Vapor Deposition) method, which can provide a covering effect on the plastics compositions to improve the cleanliness performance of the parts. On the other hand, new polymer coating process can also be used to generate a micro-scale acrylate coating layer on the glass reinforced high performance polymer parts to meet ultra-clean requirements from the growing HDD market. Furthermore, the metallization and polymer coating method can be combined to achieve an excellent covering effect on the glass filler reinforce the high performance amorphous polymer to improve the cleanliness performance on outgassing, leachable IC, LPC, NVR with all the performances well retained.

BRIEF DESCRIPTION OF THE DRAWINGS

These and other features, aspects, and advantages of the present invention will become better understood with reference to the following description and appended claims, and accompanying drawings where:

FIG. 5: is a summary and illustrating Standard Operating Procedures (SOP) and ASTM criteria for a cross hatch tap test;

Figure 1A:
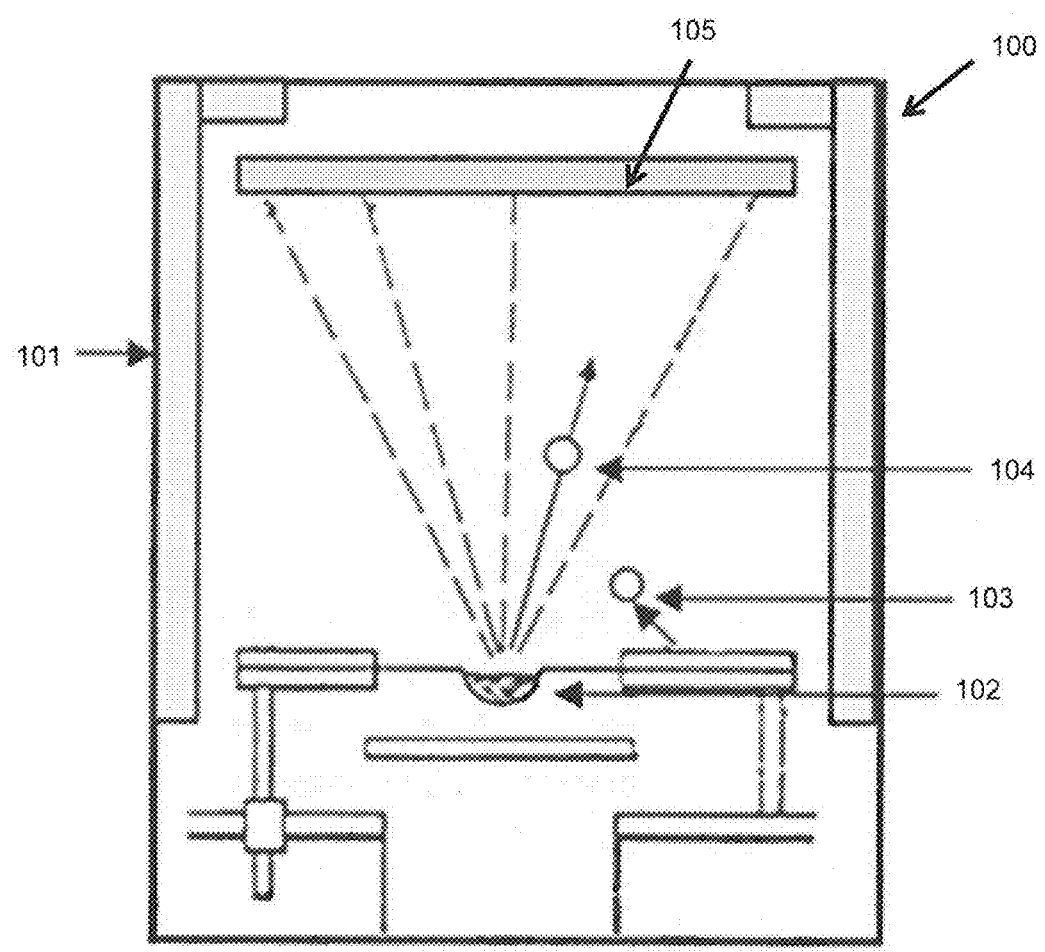
FIG. 1(A): is a schematic diagram illustrating the principle of vacuum thermal evaporation (VTE)

It should be understood that the various embodiments are not limited to the arrangements and instrumentality shown in the drawings.

DETAILED DESCRIPTION OF THE INVENTION

The invention is based, in part, on the observation that by using a specific combination of a high-heat amorphous polymeric material having a glass transition temperature of at least 180 degrees Celsius, a filler, and optionally a flow promoter, and certain process conditions, it is now possible to make products having a substrate made from the high-heat amorphous polymeric material, the filler, and optionally the flow promoter and a metallized coating or a polymeric coating, which have excellent cleanliness properties, as evidenced by products' outgassing, leachable ion chromatograph (IC), Liquid Particle Count (LPC), and non volatile residue (NVR) properties. Advantageously, products of our invention have a Liquid Particle Count that is less than 1,500 particles/cm$^2$, an EMI shielding effect higher than 30 dB, and a first coating that is disposed on the substrate and, optionally a second coating that is disposed on the first coating.

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

The term "disposed on" in this application means that a layer adheres to another layer or substrate sufficiently such that the product exhibits a cross hatch tape test a Grade 3B or higher based on ASTM D3359. For example, when the product comprises a substrate and a first layer disposed on the substrate, the term "disposed on" means that the first layer adheres to the substrate sufficiently such that the product exhibits a cross hatch tape test a Grade 3B or higher based on ASTM D3359. If the product comprises a substrate and a first layer disposed on the substrate and a second layer disposed on the second layer, the term, "disposed on" means that the second layer adheres to the first layer and the first layer adheres to the substrate sufficiently such that the product exhibits a cross hatch tape test a Grade 3B or higher based on ASTM D3359.

The term "Liquid Particle Count," as used in this application, means the number of particles having a predetermined size distribution that is detected in a liquid sample that is prepared from a product. To obtain a liquid sample suitable for analyzing particulate contamination on a product, the product is washed with water or a water and detergent solution. The liquid containing the particulates are then placed in a beaker, and the beaker containing the sample and extraction fluid is then placed in an ultrasonic bath. Particles are then extracted from the solid from the ultrasonic bath. The sample is removed after a period of time, (ordinarily within 1 to 60 minutes) and the fluid is extracted and analyzed for particulates present. Particles are measured by irradiating a liquid sample with a laser diode and detecting the scattered light. The properties of the scattered light are related to the particle size. The particle size is measured and the number of particles present in each size range is determined. The size range of the particles measured is dependent upon the detector used. In our invention, a product has a Liquid Particle Count that is less than 1,500 particles/cm$^2$; and the particles have a size distribution ranging from 300 nanometers to 2 micrometers.

The "cross hatch tape test" as used in this application is a method to determine a coating adhesion or strength of the bond between a substrate and coating, or between different coating layers or the cohesive strength of some substrates. The cross hatch tape test can be performed by cutting approximately 20-30 mm long to ensure that enough force is used to cut all the way down to the substrate. The cutter spacing depends on the coating thickness. A similar length cut at a 90 angle is made with the first cut—again, ensure that the cut is all the way down to the substrate. The coating is brushed slightly with a soft brush or tissue to remove any detached flakes or ribbons of coating, then checked the resulting cross-hatch pattern according to the Classification of Adhesion Test Results—as described in ASTM D3359 standards. An adhesive tape, in accordance with ASTM D3359 can also be used prior to checking the result.

The EMI (electromagnetic interference) shielding effect exhibited by products of our invention refers to the shielding of electromagnetic interference, common and widespread source of disruption that can interrupt electronic operations and cause electronic devices to malfunction. The EMI shielding effect can be measured by a determining the "Square Resistance" (Rs) of a sample by generating an H-field and measuring the attenuated H-field with the receiving antenna. The shielding effectiveness (SE) can be calculated from Rs as the equation: SE=20 log (377/(2*Rs)+1). A specific method for determining the EMI shielding effect is found in the Examples below.

Various embodiments relate to a composition that can include a high-heat amorphous polymeric material, a filler, and optionally at least one additive.

The composition can include an amount of a high-heat amorphous polymeric material within a range having a lower limit and/or an upper limit. The range can include or exclude the lower limit and/or the upper limit. The lower limit and/or upper limit can be selected from 5, 10, 15, 20, 25, 30, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 90, and 95% by weight based on the weight of the composition. For example, according to certain preferred embodiments, the composition can include an amount of a high-heat amorphous polymeric material in a range of from 35 to 85% by weight based on the weight of the composition.

The composition can include an amount of a filler within a range having a lower limit and/or an upper limit. The range can include or exclude the lower limit and/or the upper limit. The lower limit and/or upper limit can be selected from 5, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 55, 60, 65, 70, 75, 80, 85, 90, and 95% by weight based on the weight of the composition. For example, according to certain preferred embodiments, the composition can include an amount of a filler in a range of from 10 to 50% by weight based on the weight of the composition.

The composition can include an amount of at least one additive within a range having a lower limit and/or an upper limit. The range can include or exclude the lower limit and/or the upper limit. The lower limit and/or upper limit can be selected from 0, 1, 2, 3, 4, 5, 6, 7, 8, 9, 10, 15, 20, 25, 30, 35, 40, 45, and 50% by weight based on the total weight of the composition. For example, according to certain preferred embodiments, the composition can include an amount of at least one additive in a range of from 0 to 10% by weight based on the total weight of the composition.

The high-heat amorphous polymeric material can have a glass transition temperature within a range having a lower limit and/or an upper limit. The range can include or exclude the lower limit and/or the upper limit. The lower limit and/or upper limit can be selected from 150, 155, 160, 165, 170, 175, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 265, 270, 275, 280, 285, 290, 295, and 300 degrees Celsius. For example, according to certain preferred embodiments, the high-heat amorphous polymeric material can have a glass transition temperature of at least 180 degrees Celsius, or of from 180 to 290 degrees Celsius.

The high-heat amorphous polymeric material can include polyetherimide (PEI), polyphenylenesulfone (PPSU), polyimide (PI), polyethersulfone (PES), polysulfone (PSU), high heat polycarbonate (HH PC), and combinations thereof.

The filler can be selected from glass fiber, glass flake, flat glass fiber, glass bead, and combinations thereof.

The at least one additive can be a flow promoter, a thermal stabilizer, a mold release agent, and combinations thereof. The flow promoter can include a polyamide, and/or a liquid crystal polymer. The flow promoter can be polyphthalamide (PPA). The flow promoter can be a liquid crystal polymer and wherein the liquid crystal polymer is an aromatic polyester.

Another embodiment relates to a product that can include a substrate a first layer disposed on the substrate; and optionally a second layer disposed on the first layer.

The first layer and the second layer can be independently selected from a metallized coating and a polymeric coating. The substrate can include the composition described according to the embodiments, i.e., a composition including from 35 to 85% by weight based on the weight of the composition of a high-heat amorphous polymeric material, having a glass transition temperature of at least 180 degrees Celsius, from 10 to 50% by weight based on the weight of the composition of a filler selected from the group consisting of glass fiber, glass flake, flat glass fiber, glass bead, and combinations thereof; and from 0 to 10% by weight of composition of at least one additive selected from the group consisting of a flow promoter, a thermal stabilizer, a mold release agent, and combinations thereof.

The metallized coating can be formed by physical vapor deposition e.g., sputtering, vacuum thermal evaporation (VTE), and combinations thereof. The metallized coating can include at least one metal selected from the group consisting of Cu, Ni, Cr, and Al. The metallized coating can be formed on at least one surface of the substrate. The metallized coating can be formed on opposing surfaces of the substrate.

The metallized coating can have a thickness within a range having a lower limit and/or an upper limit. The range can include or exclude the lower limit and/or the upper limit. The lower limit and/or upper limit can be selected from 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, 500, 510, 520, 530, 540, 550, 560, 570, 580, 590, and 600 nm. For example, according to certain preferred embodiments, the metallized coating can have a thickness of from 100 to 500 nm.

The polymeric coating can include an acrylic moiety containing oligomer or monomer: a photoinitiator; and at least one selected from a leveling agent, a diluting agent, and combinations thereof.

The polymer coating can have a thickness within a range having a lower limit and/or an upper limit. The range can include or exclude the lower limit and/or the upper limit. The lower limit and/or upper limit can be selected from 1, 5, 6, 7, 8, 9, 10, 11, 12, 13, 14, 15, 16, 17, 18, 19, 20, 25, 30, 35, 40, 45, 50, 55, 60, 65, 70, 75, 80, 85, 90, 95, and 100 μm. For example, according to certain preferred embodiments, the polymer coating can have a thickness of from 5 to 20 μm.

The first layer can be the polymeric coating and the second layer can be the metallized coating. The first layer can be the metallized coating and the second layer can be the polymeric coating.

The product can exhibit a good cross hatch tape test rating of Grade 5B based on ASTM D3359. In another embodiment, the product exhibits a cross hatch tape test rating of at least a Grade 3B based on ASTM D3359. In another embodiment, the product exhibits a cross hatch tape test rating ranging within the range of a Grade 3B, Grade 4B, and Grade 5B, based on ASTM D3359. In another embodiment, The product can exhibit an EMI shield effect within a range having a lower limit and/or an upper limit. The range can include or exclude the lower limit and/or the upper limit. The lower limit and/or upper limit can be selected from 20, 21, 22, 23, 24, 25, 26, 27, 28, 29, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, and 200 dB. For example, according to certain preferred embodiments the product can exhibit an EMI shield effect higher than 30 dB.

The product can exhibit a low outgassing detection at 85° C. showing a Total Oxidizable Carbon (TOC) within a range having a lower limit and/or an upper limit. The range can include or exclude the lower limit and/or the upper limit. The lower limit and/or upper limit can be selected from 0, 10, 20, 30, 40, 50, 60, 70, 80, 90, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490, 500, 510, 520, 530, 540, 550, 560, 570, 580, 590, 600, 610, 620, 630, 640, 650, 660, 670, 680, 690, 700, 710, 720, 730, 740, 750, 760, 770, 780, 790, 800, 810, 820, 830, 840, 850, 860, 870, 880, 890, 900, 910, 920, 930, 940, 950, 960, 970, 980, 990, 1000, 1100, 1200, 1300, 1400, 1500, 1600, 1700, 1800, 1900, and 2000 ng/cm². For example, according to certain preferred embodiments, the product can exhibit a low outgassing detection at 85° C. showing a Total Oxidizable Carbon (TOC) lower than 1000 ng/cm².

The product can exhibit low total leachable ion Chromatography (IC) detection showing a concentration of anions within a range having a lower limit and/or an upper limit. The range can include or exclude the lower limit and/or the upper limit. The lower limit and/or upper limit can be selected from 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 65, 70, 75, 80, 85, 90, 95, and 100 ng/cm². For example, according to certain preferred embodiments, the product can exhibit low total leachable Ion Chromatography (IC) detection showing a concentration of anions lower than 60 ng/cm².

The product can exhibit a low Liquid particle Counting (LPC) value after 5 time ultrasonic DI water wash within a range having a lower limit and/or an upper limit. The range can include or exclude the lower limit and/or the upper limit. The lower limit and/or upper limit can be selected from 0, 50, 100, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450, 1500, 1550, 1600, 1650, 1700, 1750, 1800, 1850, 1900, 1950, and 2000 1,500 particles/cm². For example, according to certain preferred embodiments, the product can exhibit a low Liquid particle Counting (LPC) value after 5 time ultrasonic DI water wash of lower than 1,500 particles/cm².

The product can exhibit a low Non-volatile residue (NVR) detected by Gas Chromatography/Mass Spectrometry (GC-MS) showing a Total Oxidizable Carbon (TOC) within a range having a lower limit and/or an upper limit. The range can include or exclude the lower limit and/or the upper limit. The lower limit and/or upper limit can be selected from 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60, 65, 70, 75, 80, 85, 90, 95, and 100 ng/cm². For example, according to certain preferred embodiments, the product can exhibit a low Non-volatile residue (NVR) detected by Gas Chromatography/Mass Spectrometry (GC-MS) showing a Total Oxidizable Carbon (TOC) lower than 30 ng/cm2. The product can exhibit a total hydrocarbon detected by Gas Chromatography/Mass Spectrometry (GC-MS) of lower than 2 ng/cm².

The product can exhibit a total IRGAFOS® detected by Gas Chromatography/Mass Spectrometry (GC-MS) within a range having a lower limit and/or an upper limit. The range can include or exclude the lower limit and/or the upper limit. The lower limit and/or upper limit can be selected from 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 3, 4, 5, 6, 7, 8, 9, 10, 11, 12, 13, 14, 15, 16, 17, 18, 19, and 20 ng/cm². For example, according to certain preferred embodiments, the product can exhibit a total IRGAFOS® detected by Gas Chromatography/Mass Spectrometry (GC-MS) lower than 2 ng/cm².

According to some embodiments, the product can be in the form of a hard disc drive enclosure. The hard disc drive enclosures encompassed by our invention can be dimensioned to enclose numerous types of hard disc drive. Generally, a hard disc drive consists of one or more rigid ("hard") rapidly rotating discs (platters) coated with magnetic material, with magnetic heads arranged on a moving actuator arm to read and write data to the surfaces. In one embodiment, the hard disc drive is for an enclosure for a hard disk drive comprising a disk base; a spindle motor mounted on the disk base and coupled to at least one disk to create at least one rotating disk surface; a head stack assembly pivotably mounted to the disk base to position through at least actuator arm a slider over the rotating disk surface; and an arm limiter mounted to the disk base and containing at least finger positioned near the actuator arm when parked to limit shock movement acting through the actuator arm perpendicular to the disk base. Hard disc drive enclosures can be made by any suitable method such as injection molding. The dimensions of the hard disc drive can vary. In one embodiment, the length of the enclosure can vary. In one embodiment, the hard disc drive has a length ranging from 30-250 mm, a width ranging from 10-150 mm cm, and a height ranging from 1-50 mm According to some embodiments, the product can exhibits a flexural modulus within a range having a lower limit and/or an upper limit. The range can include or exclude the lower limit and/or the upper limit. The lower limit and/or upper limit can be selected from 7000, 7500, 8000, 8100, 8200, 8300, 8400, 8500, 8600, 8700, 8800, 8900, 9000, 9100, 9200, 9300, 9400, 9500, 9600, 9700, 9800, 9900, 10000, 11000, 12000, 13000, 14000, 15000, 16000, 17000, 18000, 19000, 20000, 21000, 22000, 23000, 24000, and 25000 Mpa. For example, according to certain preferred embodiments, according to some embodiments, the product can exhibits a flexural modulus higher than 8,000 MPa.

The product can exhibit a tensile stress within a range having a lower limit and/or an upper limit. The range can include or exclude the lower limit and/or the upper limit. The lower limit and/or upper limit can be selected from 50, 60, 70, 80, 90, 100, 110, 120, 130, 140, 150, 160, 170, 180, 190, 200, 250, 300, 350, 400, 450, 500, 550, 600, 650, 700, 750, 800, 850, 900, 950, 1000, 1100, 1200, 1300, 1400, 1500, 1600, 1700, 1800, 1900, and 2000 Mpa. For example, according to certain preferred embodiments, the product can exhibit a tensile stress higher than 100 MPa.

The product can exhibit an heat deflection temperature (HDT) within a range having a lower limit and/or an upper limit. The range can include or exclude the lower limit and/or the upper limit. The lower limit and/or upper limit can be selected from 150, 160, 170, 180, 190, 200, 205, 210, 215, 220, 225, 230, 235, 240, 245, 250, 255, 260, 265, 270, 275, 280, 285, 290, 295, 300, 310, 320, 330, 340, 350, 360, 370, 380, 390, 400, 450, 500, 550, 600, 650, 700, 750, 800, 850, 900, 950, and 1000 degrees Celsius. For example, according to certain preferred embodiments, the product can exhibit a heat deflection temperature (HDT) higher than 180 degrees Celsius.

The product can exhibit a notched impact strength within a range having a lower limit and/or an upper limit. The range can include or exclude the lower limit and/or the upper limit. The lower limit and/or upper limit can be selected from 10, 20, 30, 40, 50, 51, 52, 53, 54, 55, 56, 57, 58, 59, 60, 65, 70, 75, 80, 85, 90, 95, 100, 110, 120, 130, 140, 150, 160, 170, 180, 190, 200, 250, 300, 350, 400, 450, 500, 550, 600, 650, 700, 750, 800, 850, 900, 950, and 1000 J/m. For example, according to certain preferred embodiments, the product can exhibit a notched impact strength higher than 50 J/m.

Various embodiments relate to a filler reinforced high heat polymer composition with improved cleanliness that contains the following components: at least one of the high heat amorphous polymers, whose glass transition temperature is above 180 degrees Celsius, preferably the polymer a polyetherimide; an appropriate thermoplastic resin blended with the above polymer(s); at least one filler, or a combined fillers composed of glass fiber, glass flake, flat glass fiber, and glass bead, wherein the glass loading is from 10-60 weight percent based on the total weight of the composition; and other additives such as flow promoter, thermal stabilizer, mold release loading from 0-10 weight percent based on the total weight of the composition.

Various embodiments relate to a metallization process on the plastic resin surface, which includes a metal layer having a thickness of from 200 nm to 500 nm. The metal layer can include single metal layer, i.e., Cu, Ni, Cr, or Al, or double metal layers, i.e., Cr/Ni, to realize Electro Magnetic Interference shielding (EMI) function and to facilitate mass production. The metallization method can include sputtering and vacuum thermal evaporation (VTE) methods for metal film preparation in lab or mass production in plant. According to various embodiments the process can include an etching step: in-situ oxygen plasma treatment in the metallization chamber can be employed for pretreatment of plastic plaques to improve the film adhesion on surface.

Other embodiments relate to surface polymer coating processes on the plastic resin surface. Coating can be carried out either before metallization or after metallization. The coating process can include spray coating, dip coating, and flow coating. The coating can be an acrylate mixture, which can be cured by a UV lamp. The coating can mainly be made of acrylate oligomers and monomers, photoinitiators, leveling agent, and diluting agents. The coating layer thickness can range from 1 µm, or from 5 µm to 20 µm.

According to various embodiments, the coating can be introduced onto the surface of a polyetherimide substrate by spray coating, dip coating, or flow coating. After coating, the diluting agents which can be ethyl acetate, butyl acetate, isopropanol, n-butanol, 1-methoxy 2-propanol, ethylene glycol monoethyl ether, or the mixture of the chemicals mentioned above. The drying temperature can be from 25-70 degrees Celsius for 1-30 minutes. The coating can be UV-based, and can be cured by UV lamp with energy bigger than 500 mJ/cm$^2$. The pencil hardness of the coating layer can be higher than 2H at 1000 g loading.

The invention is further described in the following illustrative examples in which all parts and percentages are by weight unless otherwise indicated.

EXAMPLES

Table 1 provides a summary of materials used in the Examples.

TABLE 1

| COMPONENT | CHEMICAL DESCRIPTION | SOURCE |
| --- | --- | --- |
| ULTEM ® 1010 | polyetherimide | SABIC |
| LCP A2500 | Wholly aromatic liquid crystal polyester resin | UNEO Fine Chemicals Industry, Ltd. |
| Amodel PPA A1006 | Polyphthalamide | Solvay Advanced Polymers, LLC. |
| RADEL PPSU R5100NT | Polyphenylenesulfone | Solvay Advanced Polymers, LLC. |
| OC GF | Glass fiber | Owens Corning |
| Flat fiber 3PA-820 | Flat fiber | Nittobo |
| NSG Fineflake MEG160FYX coated | Fineflake | Nippon sheet glass |

Table 2 provides a summary of the coating materials used in the Examples.

TABLE 2

| Component | Description | Source | F01 WT % Formulation | F02 WT % Formulation | S01 WT % Formulation |
|---|---|---|---|---|---|
| SR238 | 1,6 Hexanediol diacrylate | Sartomer | 12.4 | 14.5 | 12 |
| SR399 | Dipentaerythritol pentaacrylate | Sartomer | 62.5 | | 49.9 |
| EB 8702 | six-functional aliphatic acrylate urethane | Cytec | 20 | | |
| Darocure 1173 | 2-Hydroxy-2-methyl-1-phenyl-1-propanone | BASF | 5 | | |
| BYK-310 | leveling agent | BYK | 0.1 | | 0.1 |
| EB8215 | aliphatic urethane acrylate | Cytec | | 80 | |
| EB168 | acidic methacrylate | Cytec | | 0.4 | |
| Irgacure 184 | 1-hydroxy-cyclohexyl-phenyl ketone | BASF | | 5 | 6 |
| EB350 | levelling agent | Cytec | | 0.1 | |
| SR351 | Trimethylolpropane triacrylate | Sartomer | | | 22 |
| SR610 | Polyethylene glycol (600) diacrylate | Sartomer | | | 10 |

Techniques & Procedures

Compounding and Molding: The examples include polymer blends filled with mixed fillers of different ratios. All the ingredients were dry blended for 3-5 minutes in a super-floater except for the glass fiber. The resins were pre-dried at 150° C. for about 4 hours before extrusion. The glass fiber was fed at the down-stream with a side feeder. The blends were added at the throat. Formulations were compounded on a 37 mm Toshiba twin-screw with vacuum vented extruder at 340-360° C. barrel set temperature with 300-350 rpm and 50-60 kg/hr. After compounding, pellets were dried 4-6 hours at 150° C. and injection molded on a 110 ton Fanuc injection molding machine; ASTM bars were molded with barrel temperature setting at 340-360° C. and mold temperature 150° C.

Metallization Method: molded plastic plaques were washed by an ultrasonic cleaner in pure water and baked at 120° C. for 2 hours. Subsequently, the plastic plaques were treated by Oxygen Plasma in a chamber before Physical Vapor Deposition (PVD). The desired metal film was fabricated, by a PVD method.

Metallization Method Via Physical Vapor Deposition (PVD) Technology: PVD includes two vacuum deposition methods, i.e., vacuum thermal evaporation (VTE) and sputtering, to deposit thin films by the condensation of a vaporized form of the desired film material onto the plastic plaques. The molded plastic plaques were washed by an ultrasonic cleaner in pure water and baked at 120° C. for 2 hours. Subsequently, the plastic plaques were treated by Oxygen Plasma in a chamber before metallization. The desired metal film was fabricated by a sputtering or a vacuum thermal evaporation (VTE) method. The sputtering was undertaken at 80-100° C. for 1-3 minutes including the vacuum loading/unloading time.

Figure 1B:
FIG. 1(B): is a photograph of a mass production thermal evaporation instrument.

Aluminum Deposition Via Vacuum Thermal Evaporation (VTE) Method: an Al film to be deposited is heated to a high vapor pressure by electrically resistive heating in "low" vacuum. The principle of (a) vacuum thermal evaporation (VTE) and (b) the mass production instrument are shown in FIG. 1. FIG. 1(A) is a schematic diagram illustrating the principle of vacuum thermal evaporation (VTE). FIG. 1(B) is a photograph of a mass production thermal evaporation instrument. Referring to FIG. 1(A), a thermal evaporation is shown. The thermal evaporation chamber 100 can have walls 101 having a protective coating applied thereon. At a base portion of the chamber 100, a source material 102 is positioned. The source material 102 can be heated so that degassing 103 occurs and such that material 104 evaporated from the source material 102 contacts a substrate 105 positioned at a top portion of the chamber 100 opposing the base portion of the chamber 100.

Figure 2:
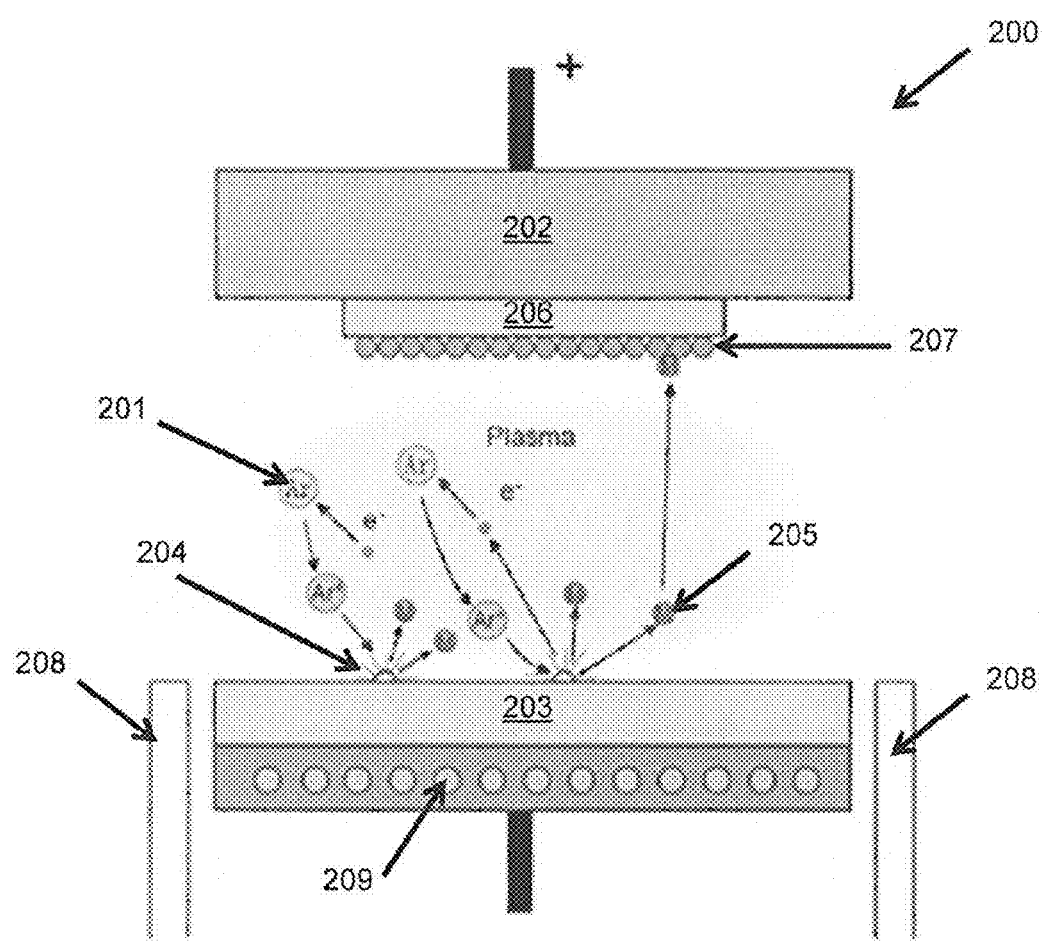
FIG. 2: is a schematic diagram illustrating the principle and process of DC diode sputtering.

Copper, Cr/Ni Alloy, Cr and Ni Deposition Via Sputtering Method: Sputter deposition is a physical vapor deposition (PVD) method of depositing thin films by sputtering, that is ejecting, material from a source "target," which then deposits onto a "substrate," such as molded plastic plaques. There are two sputtering methods. The simplest form is employs a DC Diode, as shown in FIG. 2. FIG. 2 is a schematic diagram illustrating the principle and process of DC diode sputtering. Referring to FIG. 2, in a DC diode sputtering system 200, Argon 201 is ionized by a strong potential difference between an anode 202 and a cathode 203, and these ions are accelerated to a target 204. After impact, target atoms 205 are released and travel to the substrate 206 where they form layers of atoms in the thin-film 207. As illustrated in FIG. 2, the DC diode sputtering system 200 can include a ground shield 208 and water cooling channels 209.

Figure 3:
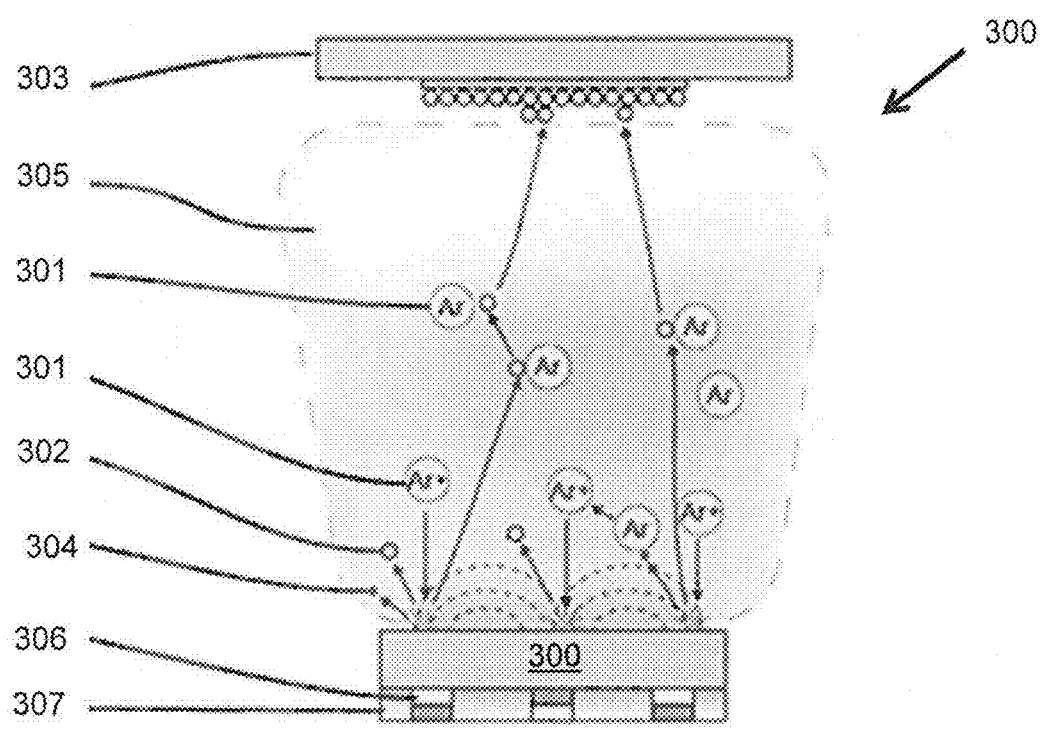
FIG. 3: is a schematic diagram illustrating the principle and process of DC Magnetron sputtering.

Another sputtering method employs a DC Magnetron as shown in FIG. 3. FIG. 3 is a schematic diagram illustrating the principle and process of DC Magnetron sputtering. Referring to FIG. 3, the basic components of a magnetron sputtering system 300 are shown. Ionized Argon 301 bombards a target 308, releasing target atoms 302 which form layers on a substrate 303. Electrons 304 and Argon ions form a plasma having a glow discharge 305, which is located near the target due to a magnetic field created by magnets 306, resulting in greater efficiency and quality. Cooling water 307 can be employed to cool the target 308.

A variety of cleanness testing methods were employed, including: dynamic headspace outgassing; non-volatile organic residue; Ionic residue; liquid particle counting (LPC); crosshatch Test; and electromagnetic interference (EMI) testing. Each of these testing methods is described in greater detail in the following paragraphs.

Dynamic Headspace (DHS) Outgassing: To measure the volatile residue (DHS/out gassing) by GC-MS, a specimen can be collected under 85° C. for 3 hours with molded parts then detected by a dynamic head-space Gas Chromatograph/Mass Spectrometer (DHS-GCMS).

Non-Volatile Organic Residue: To measure the non-volatile residue (NVR) on components by GC-MS which is analyzing the residue from solvent (Hexane) extraction and quantifying any $C_{18}$ to $C_{40}$ hydrocarbon, Irgafos, Irgafos oxidized and cetyl esters of $C_{14}$, $C_{16}$ & $C_{18}$ fatty acids. This method includes the steps of testing parts that are soaked with 10 ml hexane for 10 minutes. 8 ml of solution is dried to remove the solvent, then 1 mL hexane is added to resolubilize the solution. The solution is again dried and then 50 μL D10-Anthracene-2 ppm standard in methylene chloride is added. Total $C_{18}$-$C_{40}$ Hydrocarbons (HC, refer to an organic compound that contains only carbon and hydrogen) and TOC are measured for target materials using a Gas Chromatograph/Mass Spectrometer (GCMS) with the injector temperature at 300° C.

Ionic Residue: To measure the total ionic contamination and residue including fluoride, chloride, nitride, bromide, nitrate, phosphate, sulfate, and ammonium ions by ion chromatography (IC). The test specimen was rinsed by deionized (DI) water at a temperature of 85° C. for 1 hour, and then tested by ion chromatography.

LPC: Liquid particle counting to measure the amount of residual particles on components with ultrasonic extracting the particles then counting by Liquid Particle Count (LPC). The system was combined with one PMS LPC, two Crest Custom 40 kHz and 68 kHz ultrasonic cleaners and one 100CLASS clean bench, which can measure from 200 nm to 2 μm residual particles on the part surface.

Figure 4:
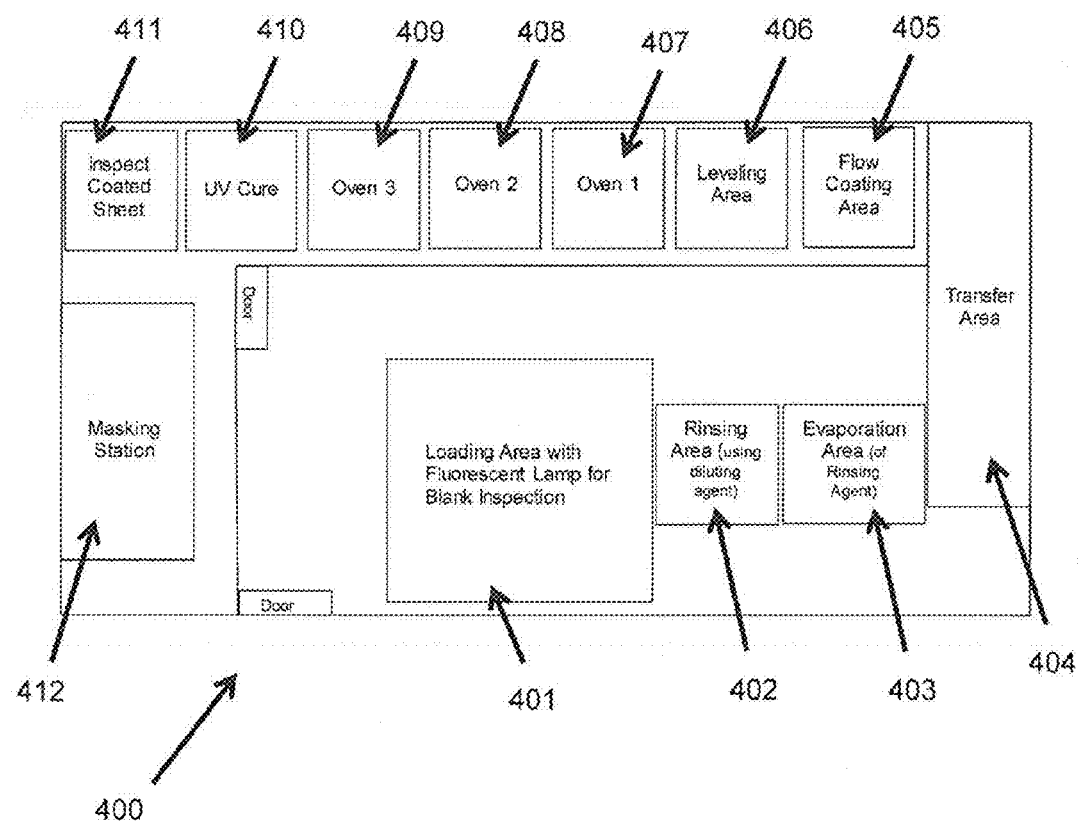
FIG. 4: is a schematic diagram illustrating the steps of a flow coating process.

Flow coating is used in this case. Polyetherimide (PEI) plaque with/without metallization layer was fixed onto a mobile holder. Then the holder moved with a track at a moving speed of 1-2 m/min. A coating liquid which came out from a nozzle flowed onto the surface of PEI plaque. Following that, the plaque was dried at 40° C. for 20 minutes to remove diluting agent completely, and was cured by high-pressure mercury lamp with UVA intensity at 250 mW/cm² and UV energy at 1000 mJ/cm². UV-cured products were collected and tested. FIG. 4 shows the detail steps of the flow coating process. FIG. 4 is a schematic diagram illustrating the steps of a flow coating process 400. Referring to FIG. 4, the flow coating process 400 can include a plurality of stations through which blanks can be moved sequentially. The flow coating process can include a loading Area 401 with a fluorescent lamp for inspecting blanks; a rinsing area 402 where the blanks can be rinsed with a diluting agent: an evaporation area 403, wherein the blanks can be rinsed with a rinsing agent: a transfer area 404; a flow coating area 405; a leveling area 406; one or more ovens 407, 408, 409; a UV Curing station 410; an inspection station 411 for inspecting a coated sheet; and a masking station 412. Other configurations are, of course, possible.

Crosshatch Tap Test: The crosshatch tap test followed ASTM D3359. The Standard Operating Procedures (SOP) and ASTM document was described as showed in FIG. 5. "5B" means best and "0B" means worst. FIG. 5 is a summary and illustrating Standard Operating Procedures (SOP) and ASTM criteria for a cross hatch tap test. Referring to FIG. 5, surfaces having an ISO (ASTM) cross hatch tap test value of 0 (5B), 1 (4B), 2 (3B), 3 (2B), 4 (1B), and 5 (0B) are shown and described. A surface with an ASTM cross hatch tap test value of 0 (5B) is described as follows: the edges of the cuts are completely smooth/none of the squares of the lattice is detached. A surface with an ASTM cross hatch tap test value of 1 (4B) is described as follows: detachment of flakes of the coating at the intersections of the cuts; a cross cut area not significantly greater than 5% is affected. A surface with an ASTM cross hatch tap test value of 2 (3B) is described as follows: the coating has flaked along the edges and/or at the intersections of the cuts; a cross cut area significantly greater than 5%, but not significantly greater than 15% is affected. A surface with an ASTM cross hatch tap test value of 3 (2B) is described as follows: the coating has flaked along the edges of the cuts partly or wholly large ribbons, and/or it has flaked partly or wholly on different parts of the squares; a cross cut area significantly greater than 15%, but not significantly greater than 35%, is affected. A surface with an ASTM cross hatch tap test value of 4 (1B) is described as follows: the coating has flaked along the edges of the cuts in large ribbons and/or some squares have detached partly or wholly; a cross cut area significantly greater than 35%, but not significantly greater than 65%, is affected. A surface with an ASTM cross hatch tap test value of 5 (0B) is described as follows: any degree of flaking that cannot be classified even by classification 4 (1B).

Figure 6:
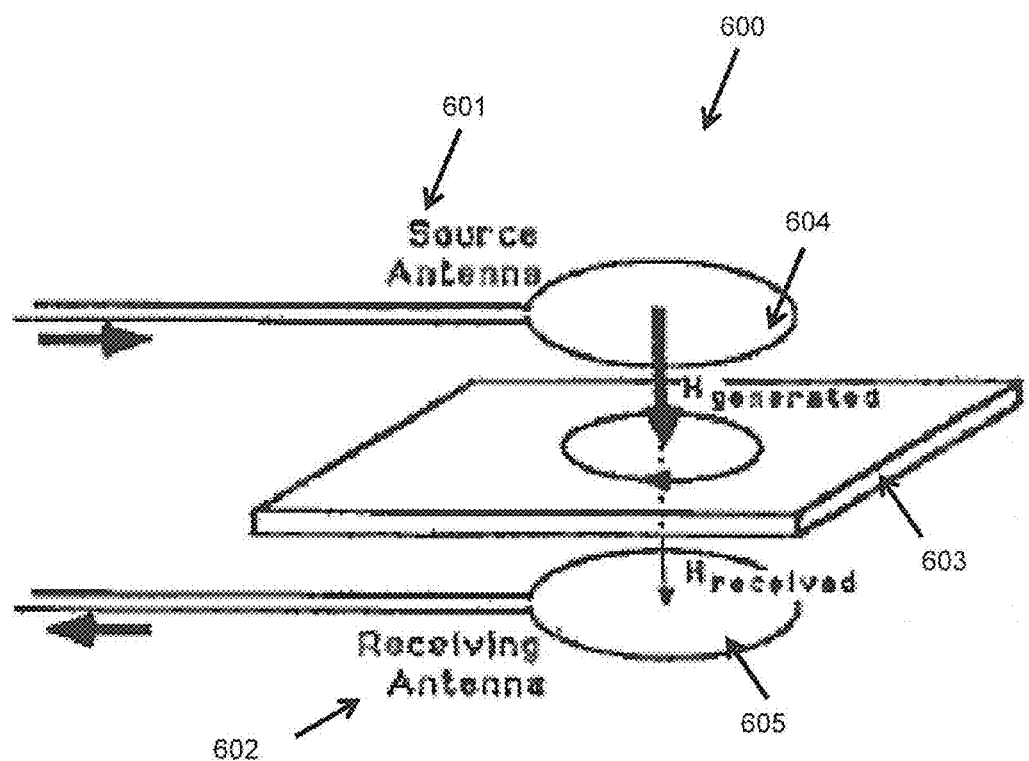
FIG. 6: is a schematic diagram illustrating a 2-probe Faradex Meter instrument and process.

EMI Shielding: a 2-probe method as showed in FIG. 6 can be used to determine the "Square Resistance" (Rs) of a sample by generating an H-field and measuring the attenuated H-field with the receiving antenna. Then the shielding effectiveness (SE) can be calculated from Rs as the equation: SE=20 log (377/(2*Rs)+1). FIG. 6 is a schematic diagram illustrating a 2-probe Faradex Meter instrument 600 and process. Referring to FIG. 6, the 2-probe Faradex Meter instrument 600 has a source antenna 601 and a receiving antenna 602. A sample 603 can be disposed between the source antenna 601 and the receiving antenna 602. The source antenna generates and H-field 604. The receiving antenna 602 can measure an attenuated H-field 605. The current induced in the sample 603 is a direct measure of the Square Resistance (Rs) of the sample 603.

All the other tests employed according to the examples are based on ASTM and ISO standards as summarized in Table 3.

TABLE 3

| Test Name | Test Standard | Default Specimen Type | Units |
|---|---|---|---|
| ASTM Flexural Test | ASTM D790 | Bar - 127 × 12.7 × 3.2 mm | MPa |
| ASTM HDT Test | ASTM D648 | Bar - 127 × 12.7 × 3.2 mm | ° C. |
| ASTM HDT Test | ASTM D648 | Bar - 127 × 12.7 × 3.2 mm | ° C. |
| ASTM Filled Tensile Test | ASTM D638 | ASTM Type I Tensile bar | MPa |
| ASTM Izod at Room Temperature | Notched ASTM D256 | Bar - 63.5 × 12.7 × 3.2 mm | J/m |
| Shrinkage | GEP Method | Disk - 101.6 mm dia × 3.2 mm thick | % |

TABLE 3-continued

| Test Name | Test Standard | Default Specimen Type | Units |
|---|---|---|---|
| Capillary melt viscosity | ASTM D3835 | Pellets | Pa · s |
| ASTM Melt Flow Rate | ASTM D1238 | Pellets | g/10 min |
| ISO Coefficient of Thermal Expansion | ISO 11359-2 | Multi-purpose ISO 3167 Type A | um/(m-° C.) |

Example 1

In this Example a variety of polymer blends filled with mixed fillers of different ratios were compared. Neat ULTEM® resin is an ultra-clean polyetherimide (PEI) material, which is widely used in semi-conductor applications. 30 wt. % standard chopped glass was compounded with the PEI resin at 360° C. and molded at 360° C. to ASTM bars for ASTM testing. A hard disc drive top cover was also molded at 360° C., followed undertaken secondary coating and materialization process for cleanliness testing and the results are summarized below in Table 4.

Example 1-1 was a reference example with traditional 30% glass fiber (GF) filled ULTEM® grade and showed excellent mechanical, heat, impact properties. However, higher non-volatile residue (NVR), liquid particle counting (LPC) were detected on the molded part due to high loading glass floated on the part surface, while the outgassing and ion can be controlled in an acceptable level. The molded part of the Example 1-1 also showed no electromagnetic interference (EMI) shielding effect due to high volume resistance.

In Examples 1-2 and 1-3, the metallization and acrylate coating process was undertaken on the same materials substrate of Example 1-1.

Examples 1-2 is a failure examples due to the poorer adhesive between Cr/Ni metal layer and the F01 coating layer which resulted cross hatch tap test result is 0B, indicating that the Cr/Ni metal layer was not disposed on the F01 layer. F01 acrylate coating formulation was flow coated on the plastics surface, followed by sputtering a 200 nm Ni/Cr alloy onto the coated substrate of Example 1-2 with Structure 700. The Liquid Particle Count (LPC) was not good enough, as it was higher than 1,500 particles/cm$^2$. Although it was showed the leachable ions and organic residues are in a tiny detected level including the outgassing, hydrocarbon and an antioxidant, such as, IRGAFOS®, a secondary antioxidant, available from BASF, for use in organic substrates such as plastics, synthetic fibers, elastomers, adhesives, tackifies resins and waxes (functioning as processing agent) and in lubricants and metal working fluids (functioning as EP/AW additive). The EMI effect was also achieved.

Example 1-3 is an inventive example, which showed ultra-clean performance of the 30% filled PH composites with the acrylate coating and sputtering process.

Figure 7A:
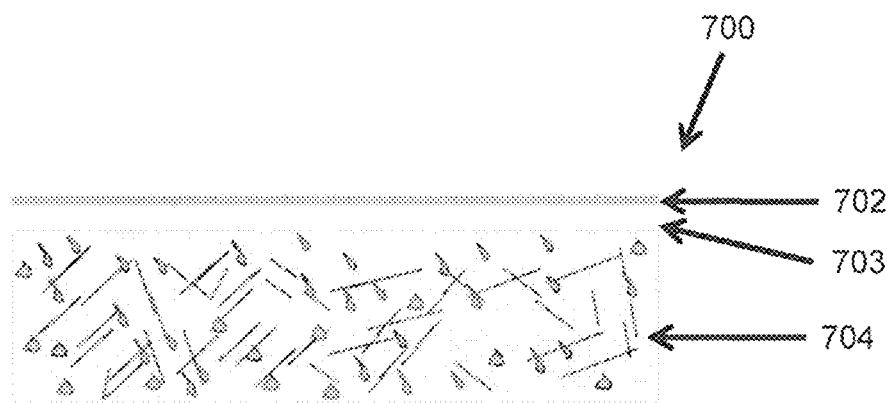
FIG. 7(A): is schematic diagram illustrating the materialization and coating structure of an Acrylate coating layer between a metal layer and a substrate.

FIG. 7(A) is schematic diagram illustrating the materialization and coating structure 700 of an Acrylate coating layer 703 between a metal layer 702 and a substrate 704.

Figure 7B:
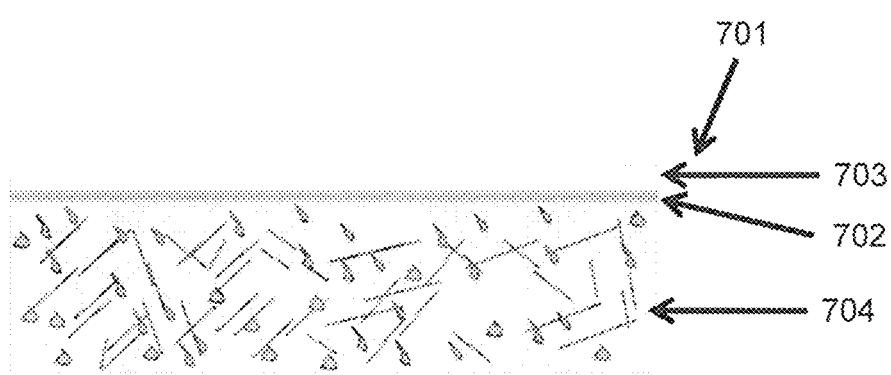
FIG. 7(B): is schematic diagram illustrating the materialization and coating structure of a metal layer between an acrylate coating layer and a substrate.

FIG. 7(B) is schematic diagram illustrating the materialization and coating structure 701 of a metal layer 702 between an acrylate coating layer 703 and a substrate 704. Referring to FIG. 7(B), A 200 nm Ni/Cr alloy sputtered on the plastics surface, followed F02 acrylate coating formulation was flow coated on the metallized substrate of Example 1-3 with structure 700 as shown in FIG. 7(A). The acceptable detected level of outgassing, leachable Ions, organic residues was observed. Due to the excellent adhesive between the F02 coating layer and Cr/Ni alloy metal layer, which the crosshatch tap test result is 5B, the liquid particle counter after 5 DI water washed was reduce to lower 1,000 particles/cm$^2$. The EMI shielding effect also was achieved at 33.4 dB with 200 nm metal layer. While the mechanical, heat, and impact performance of the examples was well balanced.

The results of Examples 1-1, 1-2, and 1-3 are summarized in Table 4.

TABLE 4

| Components | Unit | Example 1-1 (Reference) | Example 1-2 (Failure) | Example 1-3 (Invention) |
|---|---|---|---|---|
| PEI, ULTEM ®1010 | % | 70 | 70 | 70 |
| PPSU | % | | | |
| GF, OC165A | % | 30 | 30 | 30 |
| Flat fiber, 3PA-820 | % | | | |
| LCP A2500 | % | | | |
| Amodel PPA A1006 | % | | | |
| Glass flake MEG160FYX | % | | | |
| Metallization | | | | |
| sputtering or VTE metal source | | | Sputtering Cr/Ni | Sputtering Cr/Ni |
| plated layer thickness (nm) | | | 200 | 200 |
| Polymer coating, acrylate formulation | | | F01 | F02 |
| coating layer thickness (um) | % | | 5 | 5 |

TABLE 4-continued

| Components | Unit | Example 1-1 (Reference) | Example 1-2 (Failure) | Example 1-3 (Invention) |
|---|---|---|---|---|
| metallization and coating structure | % | | Structure 700 | Structure 701 |
| cross hatch tap test | % | | 0B | 5B |
| Cleanliness performance | | | | |
| Outgassing | ng/cm$^2$ | 13.4 | 1.96 | 680.6 |
| Leachable IC, anion | ng/cm$^2$ | 15.8 | 12.85 | 23.6 |
| Leachable IC, cation | ng/cm$^2$ | 2.64 | 1.85 | 2.15 |
| LPC after 5 times extraction | particles/cm$^2$ | 8762 | 3064 | 950 |
| Total Organic Compound | ng/cm$^2$ | 158.9 | 2.46 | 2.26 |
| Total Hydrocarbon | ng/cm$^2$ | 118.4 | 0 | 0 |
| Total IRGAFOS ® | ng/cm$^2$ | 20.87 | 0.92 | 1.51 |
| EMI shielding, Far field shielding | dB | no-conduct | 36.4 | 33.4 |
| Standard performance | | | | |
| Flex Modulus, 1.27 mm/min, 100 mm span | MPa | 7750 | 8050 | 7890 |
| Flex stress, 1.27 mm/min, 100 mm span | MPa | 244 | 239 | 235 |
| Ten Modulus, 5 mm/min | MPa | 9999.6 | 10260.6 | 9941.4 |
| Ten Str (SG), brk, 5 mm/min | MPa | 176.6 | 176.6 | 175.2 |
| HDT, 1.82 MPa, 3.2 mm | ° C. | 205 | 202 | 203 |
| Notched Impact, 23° C. | J/m | 84 | 89.1 | 83 |
| Unnotched Impact, 23° C. | J/m | 633 | 613 | 685 |

Example 2

The purpose of Example 2 was to evaluate the cleanliness and EMI performance of 30% glass fiber filled PEI/LCP composites and to verify the mechanical, heat, impact properties of the composites after metallization and polymeric coating. Compositions were prepared in accordance to the preparation, 10% liquid crystal polymer was introduced in the GF filled ULTEM® materials.

Example 2-1 was a reference example of 30% glass fiber (GF) filled PEI/LCP composites, which showed excellent mechanical, heat, impact properties. The higher NVR, LPC concentration were detected on the molded part, while the outgassing and ion can be controlled in an acceptable level. The molded part of the Example 2-1 showed no EMI shielding effect due to high volume resistance.

In Examples 2-2 and 2-3, the metallization and acrylate coating process was undertaken on the same materials substrate of Example 2-1.

Example 2-2 is a failure example due to the poorer adhesion between Cr/Ni metal layer and the F01 coating layer, which resulted in a cross hatch tap test result of 0ft indicating that the Cr/Ni was not disposed on the F01 layer. To prepare Example 2-2: F01 acrylate coating formulation was flow coated on plastics surface, followed by a 200 nm Ni/Cr alloy sputtered on the coated substrate to arrive at a structure as shown in structure 700 in FIG. 7(A). Further, the LPC was not good enough, because it was is higher than 1,500 particles/cm$^2$. The leachable ions and organic residues were in a tiny detected level including the outgassing, hydrocarbon and IRGAFOS®. The EMI effect was also achieved.

Example 2-3 is an inventive example, showing ultra-clean performance of the 30% filled PEI/LCP composites with the acrylate coating and sputtering process. A 200 nm Ni/Cr alloy sputtered on the plastics surface, followed F02 acrylate coating formulation was flow coated on the metallized substrate to Example 2-3 with structure 701 in FIG. 7(B). The acceptable detected level of outgassing, leachable Ions, organic residues was observed. Due to the excellent adhesive between the F02 coating layer and Cr/Ni alloy metal layer, which the crass hatch tap test result is 5B, the liquid particle counter after 5 DI water washed was reduce to lower 1,500 particles/cm$^2$. The EMI shielding effect also was achieved at 33.4 dB with 200 nm metal layer. While the mechanical, heat, and impact performance of the Examples was well-balanced. The results of Examples 2-1, 2-2, and 2-3 are summarized in Table 5,

TABLE 5

| Components | Unit | Example 2-1 (Reference) | Example 2-2 (Failure) | Example 2-3 (Invention) |
|---|---|---|---|---|
| PEI, ULTEM ®1010 | % | 60 | 60 | 60 |
| PPSU | % | | | |
| GF, OC165A | % | 30 | 30 | 30 |
| Flat fiber, 3PA-820 | | | | |
| LCP A2500 | % | 10 | 10 | 10 |
| Amodel PPA A1006 | % | | | |
| Glass flake MEG160FYX | % | | | |
| Metallization | | | | |
| sputtering or VTE | | | Sputtering | Sputtering |
| metal source | | | Cr/Ni | Cr/Ni |

TABLE 5-continued

| Components | Unit | Example 2-1 (Reference) | Example 2-2 (Failure) | Example 2-3 (Invention) |
|---|---|---|---|---|
| plated layer thickness (nm) | | | 200 | 200 |
| Polymer coating, acrylate formulation | | | F01 | F02 |
| coating layer thickness (um) | % | | 5 | 5 |
| metallization and coating structure | % | | Structure 700 | Structure 701 |
| cross hatch tap test | % | | 0B | 5B |
| Cleanliness performance | | | | |
| Outgassing | ng/cm² | 164.4 | 21.9 | 61 |
| Leachable IC, anion | ng/cm² | 13.3 | 19.36 | 34.8 |
| Leachable IC, cation | ng/cm² | 2.15 | 1.78 | 2.64 |
| LPC after 5 times extraction | particles/cm² | 8280 | 2921 | 496 |
| Total Organic Compound | ng/cm² | 73.3 | 1.48 | 7.73 |
| Total Hydrocarbon | ng/cm² | 52.5 | 0 | 0 |
| Total IRGAFOS ® | ng/cm² | 6.53 | 0.64 | 1.74 |
| EMI shielding, Far field shielding | dB | no-conduct | 35.6 | 33.4 |
| Standard performance | | | | |
| Flex Modulus, 1.27 mm/min, 100 mm span | MPa | 8920 | 9100 | 8950 |
| Flex stress, 1.27 mm/min, 100 mm span | MPa | 222 | 223 | 216 |
| Ten Modulus, 5 mm/min | MPa | 11437.6 | 11551.2 | 11500.8 |
| Ten Str (SG), brk, 5 mm/min | MPa | 155.6 | 156.2 | 152.2 |
| HDT, 1.82 MPa, 3.2 mm | ° C. | 202 | 198 | 201 |
| Notched Impact, 23° C. | J/m | 85.8 | 88 | 82.8 |
| Unnotched Impact, 23° C. | J/m | 374 | 307 | 367 |

Example 3

According to Example 3, compositions were prepared in accordance to the preparation; 40 wt. % glass filled polyetherimide (PEI) with 4 wt % Polyphthalamide (PPA) in the presence of a flow promoter. The glass contained 30 wt, % flat fiber and 10 wt. % glass flake. The coating and plating process was conducted on the plastic part. The cleanliness and EMI performance was evaluated with different mineralization and polymeric coating methods. The mechanical, heat, and impact performance were also studied.

Example 3-1 is a reference example with higher glass loading ULTEM® grade MD150 contained 40 wt. % filler which is 30 wt. % flat fiber and 10 wt. % glass flake, showed balanced heat, mechanical and impact properties. Higher outgassing and ions concentration was detected compared with Examples 1-1 30% filled ULTEM® grades while comparable LPC, NVR was observed, which also beyond the application specification.

Example 3-2 is a failure example. A 200 nm Cr/Ni alloy sputtering layer was applied onto the plastics part surface use sputtering method. The adhesive between the metal layer and plastic matrix was very good, showing a 5B value after crosshatch tap test. The outgassing, ion concentration, NVR was reduced by the cover effect of the metal layer compared with Example 3-1. While the LPC result is slightly reduced, that is not able to achieve the requirement of less than 1,500 particles/cm². The 200 nm thickness Cr/Ni layer provided significant EMI shielding effect and showed the far field shielding value at 33.4 dB.

Example 3-3 is also a failure example, 5 μm acrylate polymer coating layer was conducted on the plastics surface using F01 formulation by flow coating method. The cross hatch tap test also showed excellent adhesive between the coating layer and the plastic part. The outgassing, ion, NVR was remarkably reduce by covering 5 μm polymer coating. The LPC value can be reduced to 724 particles/cm², which was below the required value of 1,500 particles/cm². However, no EMI shielding effect.

The results of Examples 3-1, 3-2, and 3-3 are summarized in Table 6.

TABLE 6

| Components | Unit | Example 3-1 (Reference) | Example 3-2 (Failure) | Example 3-3 (Failure) |
|---|---|---|---|---|
| PEI, ULTEM ®1010 | % | 56 | 56 | 56 |
| PPSU | % | | | |
| GF, OC165A | % | | | |
| Flat fiber, 3PA-820 | % | 30 | 30 | 30 |
| LCP A2500 | % | | | |
| Amodel PPA A1006 | % | 4 | 4 | 4 |
| Glass flake MEG160FYX | % | 10 | 10 | 10 |
| Metallization | | | | |
| sputtering or VTE | | | Sputtering | |
| metal source | | | Cr/Ni | |
| plated layer thickness (nm) | | | 200 | |

TABLE 6-continued

| Components | Unit | Example 3-1 (Reference) | Example 3-2 (Failure) | Example 3-3 (Failure) |
|---|---|---|---|---|
| Polymer coating, acrylate formulation | | | | F01 |
| coating layer thickness (um) | % | | | 5 |
| metallization and coating structure | % | | | |
| cross hatch tap test | % | | 5B | 5B |
| Cleanliness performance | | | | |
| Outgassing | ng/cm² | 71 | 10 | 9 |
| Leachable IC, anion | ng/cm² | 43.4 | 24 | 33.8 |
| Leachable IC, cation | ng/cm² | 2.8 | 2.5 | 2.86 |
| LPC after 5 times extraction | particles/cm² | 6256 | 4959 | 724 |
| Total Organic Compound | ng/cm² | 128.8 | 7.79 | 2.24 |
| Total Hydrocarbon | ng/cm² | 70.6 | 0 | 0 |
| Total IRGAFOS ® | ng/cm² | 19.75 | 3.27 | 0.84 |
| EMI shielding, Far field shielding | dB | no-conduct | 33.4 | no-conduct |
| Standard performance | | | | |
| Flex Modulus, 1.27 mm/min, 100 mm span | MPa | 10400 | 10800 | 10500 |
| Flex stress, 1.27 mm/min, 100 mm span | MPa | 196 | 201 | 203 |
| Ten Modulus, 5 mm/min | MPa | 13594.4 | 13788.6 | 13362 |
| Ten Str (SG), brk, 5 mm/min | MPa | 186.6 | 183.4 | 181.4 |
| HDT, 1.82 MPa, 3.2 mm | ° C. | 194 | 193 | 193 |
| Notched Impact, 23° C. | J/m | 69.6 | 72.8 | 64.7 |
| Unnotched Impact, 23° C. | J/m | 383 | 375 | 270 |

To balance low LPC and EMI shielding effect, the plating layer and coating layer should be combined on the plastic part. In Examples 3-4 and 3-5, a 5 μm F01 coating layer was firstly conducted on the plastic surface, then 200 nm and 400 nm Cr/Ni layer sputtered outside the coating layer as described in the FIG. 7(A) as structure 700.

All the required cleanliness performance can be achieved by such method and the results showed a good EMI shielding effect. The adhesive between the coating layer and sputtering metal layer was not good, the cross hatch tap test failed at the value of 0B. As the coating thickness was increased from 5 μm to 15 μm in Example 3-6, the same result was obtained. Therefore, Examples 3-4, 3-5, and 3-6 were failure examples.

The results of Examples 3-4, 3-5, and 3-6 are summarized in Table 7.

TABLE 7

| Components | Unit | Example 3-4 (Failure) | Example 3-5 (Failure) | Example 3-6 (Failure) |
|---|---|---|---|---|
| PEI, ULTEM ®1010 | % | 56 | 56 | 56 |
| PPSU | % | | | |
| GF, OC165A | % | | | |
| Flat fiber, 3PA-820 | % | 30 | 30 | 30 |
| LCP A2500 | % | | | |
| Amodel PPA A1006 | % | 4 | 4 | 4 |
| Glass flake MEG160FYX | % | 10 | 10 | 10 |
| Metallization | | | | |
| sputtering or VTE | | Sputtering | Sputtering | Sputtering |
| metal source | | Cr/Ni | Cr/Ni | Cr/Ni |
| plated layer thickness (nm) | | 200 | 400 | 200 |
| Polymer coating, acrylate formulation | | F01 | F01 | F01 |
| coating layer thickness (um) | % | 5 | 5 | 15 |
| metallization and coating structure | % | Structure 700 | Structure 700 | Structure 700 |
| cross hatch tap test | % | 0B | 0B | 0B |
| Cleanliness performance | | | | |
| Outgassing | ng/cm² | 11.6 | 10.6 | 41.7 |
| Leachable IC, anion | ng/cm² | 15.9 | 23 | 15.3 |
| Leachable IC, cation | ng/cm² | 2.15 | 1.85 | 2.5 |
| LPC after 5 times extraction | particles/cm² | 339 | 529 | 474 |
| Total Organic Compound | ng/cm² | 2.28 | 2.67 | 1.91 |
| Total Hydrocarbon | ng/cm² | 0 | 0 | 0 |
| Total IRGAFOS ® | ng/cm² | 1.1 | 1.2 | 0.58 |
| EMI shielding, Far field shielding | dB | 37.6 | 47.4 | 38.2 |

TABLE 7-continued

| Components | Unit | Example 3-4 (Failure) | Example 3-5 (Failure) | Example 3-6 (Failure) |
|---|---|---|---|---|
| Standard performance | | | | |
| Flex Modulus, 1.27 mm/min, 100 mm span | MPa | 10700 | 10900 | 10600 |
| Flex stress, 1.27 mm/min, 100 mm span | MPa | 202 | 208 | 187 |
| Ten Modulus, 5 mm/min | MPa | 14019.8 | 13699 | 13905.2 |
| Ten Str (SG), brk, 5 mm/min | MPa | 181.6 | 179.2 | 185.4 |
| HDT, 1.82 MPa, 3.2 mm | ° C. | 192 | 191 | 192 |
| Notched Impact, 23° C. | J/m | 72.1 | 71.9 | 71.4 |
| Unnotched Impact, 23° C. | J/m | 378 | 281 | 112 |

Examples 3-7 and 3-8 are inventive examples. The coating formulation are focused on the F01 formulation, both structure 700 and 701 were undertaken as shown in FIGS. 7(A) and 7(B). Example 3-7 is Structure 700 that sputtering layer is outside the polymeric coating layer. A 200 nm Cr/Ni alloy layer is plated on the 5 μm acrylate coating layer. The adhesive between the sputtering layer and acrylate layer are very good, showing a hatch cross tap test result of 5B. The outgassing, leachable ions, organic residues of Examples 3-7 showed in an accepted low detect level with extremely low LPC value at 70 particles/cm$^2$. All the mechanical, heat, impact properties are well maintained. EMI shielding effect was also achieved. To change the sequence of the polymer coating and metallization step to build Example 3-8 as structure 701 in FIG. 7(B), the good cleanliness performance including the outgassing, leachable ions, organic residues and LPC are also achieved. The adhesive between the acrylate layer and metal layer are also good. All the performance is within the specification for HDD enclosure application.

Based on the Example 3-8, the acrylate layer thickness was increased to 15 μm in Example 3-9. The same result was achieved. Good cleanliness, adhesive, EMI, mechanical, heat, impact properties were observed. The Example 3-9 is an inventive example. All the performance is within the specification for HDD enclosure application.

Based on the Example 3-8, the metal layer thickness was increased to 400 nm in Example 3-10. The same result was achieved. Good cleanliness, adhesive, EMI, mechanical, heat, impact properties were observed. The Example 3-10 is an inventive example. All the performance is within the specification for HDD enclosure application.

The results of Examples 3-7, 3-8, 3-9, and 10 are summarized in Table 8.

TABLE 8

| Components | Unit | Example 3-7 (Invention) | Example 3-8 (Invention) | Example 3-9 (Invention) | Example 3-10 (Invention) |
|---|---|---|---|---|---|
| PEI, ULTEM ®1010 | % | 56 | 56 | 56 | 56 |
| PPSU | % | | | | |
| GF, OC165A | % | | | | |
| Flat fiber, 3PA-820 | % | 30 | 30 | 30 | 30 |
| LCP A2500 | % | | | | |
| Amodel PPA A1006 | % | 4 | 4 | 4 | 4 |
| Glass flake MEG160FYX | % | 10 | 10 | 10 | 10 |
| Metallization | | | | | |
| sputtering or VTE | | Sputtering | Sputtering | Sputtering | Sputtering |
| metal source | | Cr/Ni alloy | Cr/Ni alloy | Cr/Ni alloy | Cr/Ni alloy |
| plated layer thickness (nm) | | 200 | 200 | 200 | 400 |
| Polymer coating, acrylate formulation | | F02 | F02 | F02 | F02 |
| coating layer thickness (um) | % | 5 | 5 | 15 | 5 |
| metallization and coating structure | % | Structure 700 | Structure 701 | Structure 701 | Structure 701 |
| cross hatch tap test | % | 5B | 5B | 5B | 5B |
| Cleanliness performance | | | | | |
| Outgassing | ng/cm$^2$ | 2.9 | 21.3 | 456.3 | 231.9 |
| Leachable IC, anion | ng/cm$^2$ | 23.4 | 28 | 44.5 | 27.3 |
| Leachable IC, cation | ng/cm$^2$ | 8.22 | 4 | 4.58 | 3.93 |
| LPC after 5 times extraction | particles/cm$^2$ | 70 | 377 | 1122 | 300 |
| Total Organic Compound | ng/cm$^2$ | 3.47 | 3.21 | 2.44 | 8.12 |
| Total Hydrocarbon | ng/cm$^2$ | 0 | 0 | 0 | 0 |
| Total IRGAFOS ® | ng/cm$^2$ | 0 | 0.49 | 0.37 | 0.32 |
| EMI shielding, Far field shielding | dB | 33.7 | 33.4 | 35.6 | 33.4 |
| Standard performance | | | | | |
| Flex Modulus, 1.27 mm/min, 100 mm span | MPa | 10800 | 10700 | 10400 | 10900 |

TABLE 8-continued

| Components | Unit | Example 3-7 (Invention) | Example 3-8 (Invention) | Example 3-9 (Invention) | Example 3-10 (Invention) |
|---|---|---|---|---|---|
| Flex stress, 1.27 mm/min, 100 mm span | MPa | 203 | 202 | 194 | 206 |
| Ten Modulus, 5 mm/min | MPa | 13884 | 13894.6 | 13708.6 | 13899 |
| Ten Str (SG), brk, 5 mm/min | MPa | 182 | 183 | 185 | 181.8 |
| HDT, 1.82 MPa, 3.2 mm | ° C. | 190 | 193 | 189 | 189 |
| Notched Impact, 23° C. | J/m | 66.2 | 65.7 | 66.1 | 21.1 |
| Unnotched Impact, 23° C. | J/m | 408 | 416 | 390 | 97.5 |

Examples 3-11 and 3-12 were inventive examples. The plating metal source was changed to copper from Ni/Cr alloy with F01 coating formulation. The cross hatch tap test showed the adhesive between copper and F01 coating was better than that between Cr/Ni and F01 coating, both in Structure 700 and in Structure 701. Both of the results of Examples 3-11 and 3-12 showed 5B. Also a good result was observed on cleanliness and EMI shielding.

The results of Examples 3-11 and 3-12 are summarized in Table 9.

Example 3-13 is a failure example. F01 coating layer was first flow coated on the plastic substrate. A 10 nm Cr layer was plated on an acrylate coated plastic substrate and subsequently a 100 nm Ni layer was plated. Although all the cleanliness and adhesive performance was achieved, Example 3-13 was failed due to no EMI shielding effect with 100 nm Ni. When the Ni layer was increased to 200 nm thickness in Example 3-14, the EMI shielding effect was achieved with well balance with cleanliness performance. Therefore, Example 3-14 is an inventive example.

TABLE 9

| Components | Unit | Example 3-11 (Invention) | Example 3-12 (Invention) |
|---|---|---|---|
| PEI, ULTEM ®1010 | % | 56 | 56 |
| PPSU | % | | |
| GF, OC165A | % | | |
| Flat fiber, 3PA-820 | % | 30 | 30 |
| LCP A2500 | % | | |
| Amodel PPA A1006 | % | 4 | 4 |
| Glass flake MEG160FYX | % | 10 | 10 |
| Metallization | | | |
| sputtering or VTE | | Sputtering | Sputtering |
| metal source | | Cu | Cu |
| plated layer thickness (nm) | | 200 | 200 |
| Polymer coating, acrylate formulation | | F01 | F01 |
| coating layer thickness (um) | % | 5 | 5 |
| metallization and coating structure | % | Structure 701 | Structure 700 |
| cross hatch tap test | % | 5B | 5B |
| Cleanliness performance | | | |
| Outgassing | ng/cm² | 338.5 | 12.6 |
| Leachable IC, anion | ng/cm² | 36.9 | 28.5 |
| Leachable IC, cation | ng/cm² | 4 | 2.94 |
| LPC after 5 times extraction | particles/cm² | 1384 | 275 |
| Total Organic Compound | ng/cm² | 2.15 | 1.94 |
| Total Hydrocarbon | ng/cm² | 0 | 0 |
| Total IRGAFOS ® | ng/cm² | 0.58 | 1.04 |
| EMI shielding, Far field shielding | dB | 62.5 | 65.4 |
| Standard performance | | | |
| Flex Modulus, 1.27 mm/min, 100 mm span | MPa | 10500 | 10700 |
| Flex stress, 1.27 mm/min, 100 mm span | MPa | 198 | 192 |
| Ten Modulus, 5 mm/min | MPa | 13631.6 | 13830.2 |
| Ten Str (SG), brk, 5 mm/min | MPa | 181.6 | 183.4 |
| HDT, 1.82 MPa, 3.2 mm | ° C. | 192 | 191 |
| Notched Impact, 23° C. | J/m | 66.7 | 75.8 |
| Unnotched Impact, 23° C. | J/m | 396 | 361 |

The results of Examples 3-13 and 3-14 are summarized in Table 10,

TABLE 10

| Components | Unit | Example 3-13 (Failure) | Example 3-14 (Invention) |
|---|---|---|---|
| PEI, ULTEM ®1010 | % | 56 | 56 |
| PPSU | % | | |
| GF, OC165A | % | | |
| Flat fiber, 3PA-820 | % | 30 | 30 |
| LCP A2500 | % | | |
| Amodel PPA A1006 | % | 4 | 4 |
| Glass flake MEG160FYX | % | 10 | 10 |
| Metallization | | | |
| sputtering or VTE | | Sputtering | Sputtering |
| metal source | | 10 nmCr + 100 nmNi | 10 nmCr + 200 nmNi |
| plated layer thickness (nm) | | 100 | 200 |
| Polymer coating, acrylate formulation | | F01 | F01 |
| coating layer thickness (um) | % | 5 | 5 |
| metallization and coating structure | % | Structure 701 | Structure 701 |
| cross hatch tap test | % | 5B | 5B |
| Cleanliness performance | | | |
| Outgassins | ng/cm$^2$ | 27.9 | 439.2 |
| Leachable IC, anion | ng/cm$^2$ | 42.2 | 14.2 |
| Leachable IC, cation | ng/cm$^2$ | 6.06 | 6.56 |
| LPC after 5 times extraction | particles/cm$^2$ | 628 | 553 |
| Total Organic Compound | ng/cm$^2$ | 8.06 | 4.61 |
| Total Hydrocarbon | ng/cm$^2$ | 0 | 0 |
| Total IRGAFOS ® | ng/cm$^2$ | 5.2 | 0 |
| EMI shielding, Far field shielding | dB | no-conduct | 54.3 |

In Example 3-15, 3-16 and 3-17, 501 acrylate coating formulation was undertaken. Example 3-15 is a failure example because it did not have the required EMI shielding and LPC performance requirements. S01 coating layer was first flow coated on the plastic substrate. A 10 nm Cr layer was plated on an acrylate coated plastic substrate and subsequently a 100 nm Ni was plated. Although all the cleanliness and adhesive performance was achieved, Example 3-15 failed due to no EMI shielding effect with 100 nm Ni. When the Ni layer was increased to 200 nm thickness in Example 3-16, the EMI shielding effect was achieved with well balance with cleanliness performance. Therefore, Example 3-16 is an inventive example.

The flow coating and sputtering sequence was changed to build Example 3-17 as Structure 701 in FIG. 7. A 5 μm S01 coating layer was deposited outside the metallization layer in Example 3-17. The excellent performance of cleanliness including the outgassing, leachable ions, LPC was obtained, and good adhesive and EMI shielding effect was achieved. Therefore, Example 3-17 is an inventive example.

The results of Examples 15, 3-15, and 3-17 are summarized in Table 11.

TABLE 11

| Components | Unit | Example 3-15 (Failure) | Example 3-16 (Invention) | Example 3-17 (Invention) |
|---|---|---|---|---|
| PEI, ULTEM ®1010 | % | 56 | 56 | 56 |
| PPSU | % | | | |
| GF, OC165A | % | | | |
| Flat fiber, 3PA-820 | % | 30 | 30 | 30 |
| LCP A2500 | % | | | |
| Amodel PPA A1006 | % | 4 | 4 | 4 |
| Glass flake MEG160FYX | % | 10 | 10 | 10 |
| Metallization | | | | |
| sputtering or VTE | | Sputtering | Sputtering | Sputtering |
| metal source | | 10 nmCr + 100 nmNi | 10 nmCr + 200 nmNi | 10 nmCr + 200 nmNi |
| plated layer thickness (nm) | | 100 | 200 | 200 |
| Polymer coating, acrylate formulation | | S01 | S01 | S01 |
| coating layer thickness (um) | % | 5 | 5 | 5 |
| metallization and coating structure | % | Structure 700 | Structure 700 | Structure 701 |
| cross hatch tap test | % | 5B | 5B | 5B |

TABLE 11-continued

| Components | Unit | Example 3-15 (Failure) | Example 3-16 (Invention) | Example 3-17 (Invention) |
|---|---|---|---|---|
| Cleanliness performance | | | | |
| Outgassing | ng/cm$^2$ | 384.6 | 1.74 | 6.34 |
| Leachable IC, anion | ng/cm$^2$ | 13.4 | 32.9 | 47.4 |
| Leachable IC, cation | ng/cm$^2$ | 3.38 | 3.28 | 11.4 |
| LPC after 5 times extraction | particles/cm$^2$ | 1805 | 940 | 367 |
| Total Organic Compound | ng/cm$^2$ | 27.5 | 212 | 16.2 |
| Total Hydrocarbon | ng/cm$^2$ | 0.59 | 0 | 0 |
| Total IRGAFOS ® | ng/cm$^2$ | 0 | 0 | 0 |
| EMI shielding, Far field shielding | dB | no-conduct | 55.4 | 50.6 |

Examples 3-18, 3-19, and 3-20 employed a VTE plating method with Al. In Example 3-18, a 200 nm Al layer was plated on F01 coated substrate via VTE method as structure 700 as shown in FIG. 7(A). Although good cleanliness and EMI performance was obtained through this process, Example 3-18 failed due to the poor adhesive between the Al metal layer and F01 coating layer, the cross hatch tap test result is 0B in Example 3-18. Therefore, Example 3-18 is a failure example.

Based on Example 3-18, the acrylate coating formulation was changed to F02 formulation in Example 3-19. The same flow coating and VTE process was followed to build Structure 700. The adhesive between F02 acrylate formulation layer and Al layer was good as the cross hatch tap test showed 5B. With the excellent performance of cleanliness and EMI of Example 3-19, it is an inventive Example.

Example 3-20 was built with the same F02 acrylate coating formulation and VTE metallization Al layer on plastic substrate, while the sequence was changed to Structure 701 compare with the Example 3-19. All the cleanliness including the outgassing, leachable ions, LPC showed expectable result for HDD application. Good adhesive obtained and EMI shielding effect was also achieved. Example 3-20 is an inventive example.

The results of Examples 3-18, 3-19, and 3-20 are summarized in Table 12.

TABLE 12

| Components | Unit | Example 3-18 (Failure) | Example 3-19 (Invention) | Example 3-20 (Invention) |
|---|---|---|---|---|
| PEI, ULTEM ®1010 | % | 56 | 56 | 56 |
| PPSU | % | | | |
| GF, OC165A | % | | | |
| Flat fiber, 3PA-820 | % | 30 | 30 | 30 |
| LCP A2500 | % | | | |
| Amodel PPA A1006 | % | 4 | 4 | 4 |
| Glass flake MEG160FYX | % | 10 | 10 | 10 |
| Metallization | | | | |
| sputtering or VTE | | VTE | VTE | VTE |
| metal source | | Al | Al | Al |
| plated layer thickness (nm) | | 200 | 200 | 200 |
| Polymer coating, acrylate formulation | | F01 | F02 | F02 |
| coating layer thickness (um) | % | 5 | 5 | 5 |
| metallization and coating structure | % | Structure 700 | Structure 700 | Structure 701 |
| cross hatch tap test | % | 0B | 5B | 5B |
| Cleanliness performance | | | | |
| Outgassing | ng/cm$^2$ | 14 | 8.1 | 288.2 |
| Leachable IC, anion | ng/cm$^2$ | 30.8 | 28.9 | 42.4 |
| Leachable IC, cation | ng/cm$^2$ | 6.86 | 7.71 | 15.4 |
| LPC after 5 times extraction | particles/cm$^2$ | 320 | 466 | 371 |
| Total Organic Compound | ng/cm$^2$ | 6.64 | 10.8 | 12.6 |
| Total Hydrocarbon | ng/cm$^2$ | 1.37 | 0 | 0 |
| Total IRGAFOS ® | ng/cm$^2$ | 0.41 | 0 | 0 |
| EMI shielding, Far field shielding | dB | 61.8 | 62.8 | 52.5 |

Example 4

According to Example 4, various compositions were prepared in accordance to the preparation, the matrix polymer was changed from PD to PPSU, and the coating and plating process was conduct on the plastic part. The cleanliness and EMI performance was evaluated.

Example 4-1 was a reference example of 30% glass fiber (GF) filled PPSU composites, showing excellent mechanical, heat, impact properties. The higher NVR, LPC concentration were detected on the molded part, while the outgassing and ion can be controlled in an acceptable level. The molded part of the Example 4-1 showed no EMI shielding effect due to high volume resistance.

The metallization and acrylate coating process was undertaken on the same materials substrate of Example 4-1. F01 acrylate coating formulation was flow coated on plastics surface, followed 200 nm Ni/Cr alloy sputtered on coated substrate to Example 4-2 with structure 700 as shown in FIG. 7(A). A 200 nm Ni/Cr alloy was sputtered on the plastics surface. Subsequently, a F02 acrylate coating formulation was flow coated on the metallized substrate of Example 4-3 with the structure 701 as shown in FIG. 7(B).

Example 4-2 is a failure example due to the poorer adhesive between Cr/Ni metal layer and the F01 coating layer, which resulted in a cross hatch tap test result of 0B. Example 4-2 showed that the leachable ions and organic residues are in a tiny detected level including the outgassing, hydrocarbon and IRGAFOS®. The EMI effect and low LPC was also achieved.

Example 4-3 is an inventive example, showing ultra-clean performance of the 30% filled PPSU composites with the acrylate coating and sputtering process. The acceptable detected level of outgassing, leachable Ions, organic residues was observed. Due to the excellent adhesive between the F02 coating layer and Cr/Ni alloy metal layer, which the crass hatch tap test result is 5B, the liquid particle counter after 5 DI water washed was reduce to lower 1,500 particles/$cm^2$. The EMI shielding effect also was achieved at 33.4 dB with 200 nm metal layer. While the mechanical, heat, and impact performance of the examples was well balanced.

The results of Examples 4-1, 4-2, and 4 are summarized in Table 13,

TABLE 13

| Components | Unit | Example 4-1 (Reference) | Example 4-2 (Failure) | Example 4-3 (Invention) |
|---|---|---|---|---|
| PEI, ULTEM ®1010 | % | | | |
| PPSU | % | 70 | 70 | 70 |
| GF, OC165A | % | 30 | 30 | 30 |
| Flat fiber, 3PA-820 | % | | | |
| LCP A2500 | % | | | |
| Amodel PPA A1006 | % | | | |
| Glass flake MEG160FYX | % | | | |
| Metallization | | | | |
| sputtering or VTE metal source | | | Sputtering Cr/Ni | Sputtering Cr/Ni |
| plated layer thickness (nm) | | | 200 | 200 |
| Polymer coating, acrylate formulation | | | F01 | F02 |
| coating layer thickness (um) | % | | 5 | 5 |
| metallization and coating structure | % | | Structure 700 | Structure 701 |
| cross hatch tap test | % | | 0B | 5B |
| Cleanliness performance | | | | |
| Outgassing | $ng/cm^2$ | 81.6 | 19.4 | 198.2 |
| Leachable IC, anion | $ng/cm^2$ | 23.6 | 54.5 | 49.89 |
| Leachable IC, cation | $ng/cm^2$ | 2.15 | 2.5 | 3.73 |
| LPC after 5 times extraction | $particles/cm^2$ | 5393 | 978 | 534 |
| Total Organic Compound | $ng/cm^2$ | 70.04 | 1.75 | 6.37 |
| Total Hydrocarbon | $ng/cm^2$ | 57.1 | 0 | 0 |
| Total IRGAFOS ® | $ng/cm^2$ | 0.87 | 0.74 | 0.99 |
| EMI shielding, Far field shielding | dB | no-conduct | 36.4 | 33.4 |
| Standard performance | | | | |
| Flex Modulus, 1.27 mm/min, 100 mm span | MPa | 7140 | 7240 | 7140 |
| Flex stress, 1.27 mm/min, 100 mm span | MPa | 179 | 180 | 178 |
| Ten Modulus, 5 mm/min | MPa | 8604.2 | 8732 | 8617.2 |
| Ten Str (SG), brk, 5 mm/min | MPa | 121.4 | 121.8 | 120.2 |
| HDT, 1.82 MPa, 3.2 mm | ° C. | 213 | 209 | 212 |
| Notched Impact, 23° C. | J/m | 91.9 | 102 | 94.2 |
| Unnotched impact, 23° C. | J/m | 555 | 587 | 583 |

Example 5

According to Example 5, various compositions were prepared. The matrix polymer was changed from PEI/PPSU alloy with 35 wt. % PEI and 35 wt. % PPSU, and the coating and plating process was conduct on the plastic part. The cleanliness and EMI performance was evaluated, with balance the mechanical, heat, and impact performance.

Example 5-1 was a reference example having 30% glass fiber (GF) filled PPSU/PEI composites showed excellent mechanical, heat, impact properties. The higher NVR, LPC concentration were detected on the molded part, while the outgassing and ion can be controlled in an acceptable level. The molded part of the Example 5-1 showed no EMI shielding effect due to high volume resistance.

The metallization and acrylate coating process was undertaken on the same materials substrate of Example 5-1. An F01 acrylate coating formulation was flow coated on plastics surface, followed by a 200 nm Ni/Cr alloy sputtered on coated substrate to Example 5-2 with structure 700 as shown in FIG. 7(A). A 200 nm Ni/Cr alloy was sputtered on the plastics surface. Subsequently a F02 acrylate coating formulation was flow coated on the metallized substrate to Example 5-3 with the structure 701 as shown in FIG. 7(8).

Example 5-2 is a failure example due to the poorer adhesive between Cr/Ni metal layer and the F01 coating layer, which resulted in a cross hatch tap test result of 0B. Although Example 5-2 was showed the leachable ions and organic residues are in a tiny detected level including the outgassing, hydrocarbon and IRGAFOS®. The EMI effect and low LPC was also achieved.

Example 5-3 is an inventive example, showing ultra-clean performance of the 30% filled PPSU/PEI composites with the acrylate coating and sputtering process. The acceptable detected level of outgassing, leachable Ions, organic residues was observed. Due to the excellent adhesive between the F02 coating layer and Cr/Ni alloy metal layer, which the crass hatch tap test result is 5B, the liquid particle counter after 5 DI water washed was reduce to lower 1,500 particles/cm$^2$. The EMI shielding effect also was achieved at 33.4 dB with 200 nm metal layer. While the mechanical, heat, and impact performance of the examples was well balanced.

The results of Examples 5-1, 5-2, and 5-3 are summarized in Table 14.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state means for performing a specified function, or "step for" performing a specific function, is not to be interpreted as a "means" or "step" clause as specified in 35 U.S.C §112, sixth paragraph. In particular, the use of "step of" in the claims herein is not intended to invoke the provisions of 35 U.S.C §112, sixth paragraph.

What is claimed is:

1. A product comprising:
    a substrate, wherein the substrate comprises a composition comprising:

TABLE 14

| Components | Unit | Example 5-1 (Reference) | Example 5-2 (Failure) | Example 5-3 (Invention) |
|---|---|---|---|---|
| PEI, ULTEM ®1010 | % | 35 | 35 | 35 |
| PPSU | % | 35 | 35 | 35 |
| GF, OC165A | % | 30 | 30 | 30 |
| Flat fiber, 3PA-820 | % | | | |
| LCP A2500 | % | | | |
| Amodel PPA A1006 | % | | | |
| Glass flake MEG160FYX | % | | | |
| Metallization | | | | |
| sputtering or VTE | | | Sputtering | Sputtering |
| metal source | | | Cr/Ni | Cr/Ni |
| plated layer thickness (nm) | | | 200 | 200 |
| Polymer coating, acrylate formulation | | | F01 | F02 |
| coating layer thickness (um) | % | | 5 | 5 |
| metallization and coating structure | % | | Structure 700 | Structure 701 |
| cross hatch tap test | % | | 0B | 5B |
| Cleanliness performance | | | | |
| Outgassing | ng/cm$^2$ | 278.1 | 137.7 | 126.5 |
| Leachable IC, anion | ng/cm$^2$ | 3.7 | 3.34 | 32.2 |
| Leachable IC, cation | ng/cm$^2$ | 2.15 | 2.36 | 2.43 |
| LPC after 5 times extraction | particles/cm$^2$ | 4526 | 660 | 314 |
| Total Organic Compound | ng/cm$^2$ | 90.57 | 11.8 | 2.49 |
| Total Hydrocarbon | ng/cm$^2$ | 51.3 | 0 | 0 |
| Total IRGAFOS ® | ng/cm$^2$ | 3.85 | 1.27 | 0.31 |
| EMI shielding, Far field shielding Standard performance | dB | no-conduct | 40.3 | 33.4 |
| Flex Modulus, 1.27 mm/min, 100 mm span | MPa | 7710 | 7850 | 8020 |
| Flex stress, 1.27 mm/min, 100 mm span | MPa | 237 | 228 | 240 |
| Ten Modulus, 5 mm/min | MPa | 9230.2 | 9312.4 | 9209.4 |
| Ten Str (SG), brk, 5 mm/min | MPa | 155.6 | 155.8 | 153.4 |
| HDT, 1.82 MPa, 3.2 mm | ° C. | 208 | 201 | 206 |
| Notched Impact, 23° C. | J/m | 106 | 107 | 96.3 |
| Unnotched Impact, 23° C. | J/m | 803 | 824 | 690 |

Although the present invention has been described in considerable detail with reference to certain preferred versions thereof, other versions are possible. Therefore, the spirit and scope of the appended claims should not be limited to the description of the preferred versions contained herein.

(a) from 35 to 85% by weight based on the weight of the composition of -high-heat amorphous polymeric materials, having a glass transition temperature of at least 180 degrees Celsius wherein the high-heat amorphous polymeric materials comprise polyetherimide, polyphenylene sulfone, or a combination thereof,
(b) from 10 to 50% by weight based on the weight of the composition of filler selected from glass fiber, glass flake, flat glass fiber, glass bead, and combinations thereof; and
(c) from 0 to 10% by weight of composition of at least one additive selected from a flow promoter, a thermal stabilizer, a mold release agent, and combinations thereof;

a first layer disposed on the substrate; and a second layer disposed on the first layer, wherein the first layer is a metallized coating having a thickness of 200 to 500 nanometers and the second layer is a polymeric coating, wherein the product has a Liquid Particle Count that is less than 1,500 particles/cm$^2$;

and wherein the product has an EMI shielding effect higher than 30 dB.

2. The product of claim 1, wherein the metallized coating is formed by one selected from physical vapor deposition (PVD), thermal evaporation (VTE), and combinations thereof.

3. The product of claim 1 wherein the metallized coating comprises at least one metal selected from Cu, Ni, Cr, and Al.

4. The product of claim 1 wherein the metallized coating is formed on at least one surface of the substrate.

5. The product of claim 1, wherein the metallized coating is formed on opposing surfaces of the substrate.

6. The product of claim 1, wherein the metallized coating has a thickness of from 200 to 400 nm.

7. The product of claim 1, wherein the polymeric coating comprises
an acrylic moiety containing oligomer or monomer;
a photoinitiator; and
at least one selected from a leveling agent, a diluting agent, and combinations thereof.

8. The product of claim 7, wherein the polymer coating has a thickness of from 5 to 20 μm.

9. The product of claim 1, exhibiting
a cross hatch tape rating ranging from Grade 3B to Grade 5B based on ASTM D3359;
an EMI shield effect higher than 30 dB,
low outgassing detection at 85° C. showing Total Oxidizable Carbon (TOC) lower than 1000 ng/cm2,
low total leachable Ion Chromatography (IC) detection showing a concentration of anions lower than 60 ng/cm2,
low Liquid particle Counting (LPC) value of lower than 1,500 particles/cm2 after 5 time ultrasonic DI water wash, low Non-volatile residue (NVR) detected by Gas Chromatography/Mass Spectrometry (GC-MS) showing a Total Oxidizable Carbon (TOC) lower than 30 ng/cm2,
total hydrocarbon detected by Gas Chromatography/Mass Spectrometry (GC-MS) of lower than 2 ng/cm2, and
total Irgafos detected by Gas Chromatography/Mass Spectrometry (GC-MS) lower than 2 ng/cm2.

10. The product of claim 1 in the form of a hard disc drive enclosure.

11. The product of claim 1, exhibiting:
a flexural modulus higher than 8,000 MPa;
a tensile stress higher than 100 MPa;
a heat deflection temperature (HDT) higher than 180° C.;
a notched impact strength higher than 50 J/m.

12. A product comprising:
a substrate, wherein the substrate comprises a composition comprising:
(a) from 35 to 85% by weight based on the weight of the composition of -high-heat amorphous polymeric materials, having a glass transition temperature of at least 180 degrees Celsius wherein the high-heat amorphous polymeric materials comprise polyetherimide, polyphenylene sulfone, or a combination thereof,
(b) from 10 to 50% by weight based on the weight of the composition of filler selected from glass fiber, glass flake, flat glass fiber, glass bead, and combinations thereof;
(c) from 0 to 10% by weight of composition of at least one additive selected from, a thermal stabilizer, a mold release agent, and combinations thereof; and
(d) from 1 to 10% by weight of composition of a flow promoter comprising a polyphthalamide;

a first layer disposed on the substrate; and a second layer disposed on the first layer, wherein the first layer and the second layer are independently selected from a metallized coating having a thickness of 200 to 500 nanometers and a polymeric coating, wherein the product has a Liquid Particle Count that is less than 1,500 particles/cm$^2$;

and wherein the product has an EMI shielding effect higher than 30 dB.

* * * * *